(12) United States Patent
Liu et al.

(10) Patent No.: US 11,705,671 B2
(45) Date of Patent: Jul. 18, 2023

(54) BACKPLANE CONNECTOR ASSEMBLY WITH IMPROVED SHIELDING EFFECT

(71) Applicant: DONGGUAN LUXSHARE TECHNOLOGIES CO., LTD, Dongguan (CN)

(72) Inventors: Xiaogang Liu, Dongguan (CN); Kun Liu, Dongguan (CN); Rongzhe Guo, Dongguan (CN); Chuanqi Gong, Dongguan (CN); Tao Song, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 275 days.

(21) Appl. No.: 17/341,009

(22) Filed: Jun. 7, 2021

(65) Prior Publication Data

US 2021/0399494 A1 Dec. 23, 2021

(30) Foreign Application Priority Data

Jun. 19, 2020 (CN) .......................... 202010567796.4
Aug. 17, 2020 (CN) .......................... 202010823428.1

(51) Int. Cl.
- *H01R 13/648* (2006.01)
- *H01R 13/6471* (2011.01)

(Continued)

(52) U.S. Cl.
CPC ....... *H01R 13/6471* (2013.01); *H01R 12/585* (2013.01); *H01R 12/716* (2013.01);

(Continued)

(58) Field of Classification Search
CPC .. H01R 12/585; H01R 12/716; H01R 12/724; H01R 12/722; H01R 12/712;

(Continued)

(56) References Cited

U.S. PATENT DOCUMENTS

| 4,601,527 A | 7/1986 | Lemke |
| 5,664,968 A | 9/1997 | Mickievicz |

(Continued)

FOREIGN PATENT DOCUMENTS

| CN | 1244959 A | 2/2000 |
| CN | 2513252 Y | 9/2002 |

(Continued)

OTHER PUBLICATIONS

The Taiwanese Office Action and Search Report for Taiwanese Application No. 109128295, dated Apr. 14, 2021.

(Continued)

*Primary Examiner* — Khiem M Nguyen
(74) *Attorney, Agent, or Firm* — Birch, Stewart, Kolasch & Birch, LLP

(57) ABSTRACT

A backplane connector assembly includes a first backplane connector and a second backplane connector. The first backplane connector includes a number of first conductive terminals, a first insulating bracket, a first metal shield, a second metal shield and a shielding space. The second backplane connector includes a second terminal module. Each second terminal module includes mating terminals mated with the first conductive terminals and a shielding shell surrounding a periphery of the mating terminals. The shielding shell is received in the shielding space. As a result, the backplane connector assembly of the present disclosure reduces crosstalk and improves the quality of signal transmission.

14 Claims, 29 Drawing Sheets

(51) Int. Cl.
| | |
|---|---|
| *H01R 13/40* | (2006.01) |
| *H01R 13/6587* | (2011.01) |
| *H01R 13/6591* | (2011.01) |
| *H01R 13/514* | (2006.01) |
| *H01R 13/518* | (2006.01) |
| *H01R 12/72* | (2011.01) |
| *H01R 13/6586* | (2011.01) |
| *H01R 12/58* | (2011.01) |
| *H05K 1/11* | (2006.01) |
| *H01R 13/6588* | (2011.01) |
| *H01R 13/6583* | (2011.01) |
| *H01R 13/6585* | (2011.01) |
| *H01R 13/6582* | (2011.01) |
| *H01R 43/24* | (2006.01) |
| *H01R 12/71* | (2011.01) |
| *H01R 13/20* | (2006.01) |
| *H01R 13/504* | (2006.01) |
| *H01R 13/6461* | (2011.01) |
| *H01R 13/6584* | (2011.01) |
| *H05K 3/30* | (2006.01) |
| *H01R 13/02* | (2006.01) |
| *H05K 3/34* | (2006.01) |
| *H01R 13/6474* | (2011.01) |
| *H01R 13/502* | (2006.01) |
| *H01R 13/46* | (2006.01) |
| *H01R 13/646* | (2011.01) |
| *H01R 13/6473* | (2011.01) |
| *H01R 13/6581* | (2011.01) |

(52) U.S. Cl.
CPC ........... *H01R 12/724* (2013.01); *H01R 13/02* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H05K 3/306* (2013.01); *H05K 3/3447* (2013.01); *H01R 12/71* (2013.01); *H01R 12/712* (2013.01); *H01R 12/722* (2013.01); *H01R 13/46* (2013.01); *H01R 13/502* (2013.01); *H01R 13/646* (2013.01); *H01R 13/6473* (2013.01); *H01R 13/6474* (2013.01); *H01R 13/6581* (2013.01); *H05K 2201/09236* (2013.01); *H05K 2201/1078* (2013.01); *H05K 2201/10189* (2013.01); *H05K 2201/10371* (2013.01); *H05K 2201/10871* (2013.01)

(58) Field of Classification Search
CPC ........................ H01R 12/71; H01R 13/6471; H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 13/02; H01R 43/24; H05K 1/115; H05K 3/306; H05K 3/3447; H05K 2201/09236; H05K 2201/10189; H05K 2201/10371; H05K 2201/1078; H05K 2201/10871
USPC .................................................. 439/607.08
See application file for complete search history.

(56) References Cited

U.S. PATENT DOCUMENTS

| | | |
|---|---|---|
| 9,350,126 B2 | 5/2016 | Little et al. |
| 9,548,570 B2 | 1/2017 | Laurx et al. |
| 2004/0043658 A1 | 3/2004 | Ko |
| 2004/0229510 A1 | 11/2004 | Lloyd et al. |
| 2007/0155239 A1 | 7/2007 | Nakada |
| 2008/0014798 A1 | 1/2008 | Pan |
| 2013/0203273 A1 | 8/2013 | Rathburn |
| 2014/0051295 A1 | 2/2014 | Westman et al. |
| 2014/0248796 A1 | 9/2014 | Pan |
| 2014/0295705 A1 | 10/2014 | Lee et al. |
| 2015/0194771 A1 | 7/2015 | Pan |
| 2015/0303618 A1 | 10/2015 | Lee et al. |
| 2015/0318642 A1 | 11/2015 | Lee et al. |
| 2016/0093985 A1 | 3/2016 | Zhang et al. |
| 2016/0322760 A1 | 11/2016 | Long et al. |
| 2018/0166828 A1 | 6/2018 | Gailus |
| 2019/0044284 A1 | 2/2019 | Dunham |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203288874 U | 11/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105612664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |

(56) References Cited

FOREIGN PATENT DOCUMENTS

| | | |
|---|---|---|
| CN | 208955335 U | 6/2019 |
| CN | 109994892 A | 7/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| CN | 111682369 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I545845 B | 8/2016 |
| TW | M537321 U | 2/2017 |
| TW | 201733225 A | 9/2017 |
| TW | I600231 B | 9/2017 |
| TW | 201810825 A | 3/2018 |
| TW | I528659 B | 4/2018 |
| TW | I623154 B | 5/2018 |
| TW | 201834333 A | 9/2018 |
| TW | 201841440 A | 11/2018 |
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| TW | 202046584 A | 12/2020 |
| WO | WO 2016/168820 A1 | 10/2016 |
| WO | WO 2017/106266 A1 | 6/2017 |

OTHER PUBLICATIONS

The Taiwanese Office Action and Search Report for Taiwanese Application No. 109128294, dated Jun. 21, 2021.
The Taiwanese Office Action and Search Report for Taiwanese Application No. 109129936, dated Aug. 9, 2021.
The Taiwanese Office Action and Search Report for Taiwanese Application No. 110104066, dated Feb. 2, 2023.
The Taiwanese Office Action and Search Report for Taiwanese Application No. 110144691, dated Jan. 12, 2023.
The Chinese Office Action and Search Report for Chinese Application No. 202011577310.1, dated Nov. 23, 2021.
The Chinese Office Action and Search Report for Chinese Application No. 202110035372.8, dated Jan. 6, 2022.
The Chinese Office Action and Search Report for Chinese Application No. 202011577786.5, dated Feb. 16, 2022.
The Taiwanese Office Action and Search Report for Taiwanese Application No. 110104064, dated Dec. 9, 2021.
The Taiwanese Office Action and Search Report for Taiwanese Application No. 110104068, dated Jan. 26, 2022.
The Taiwanese Office Action and Search Report for Taiwanese Application No. 110117853, dated Feb. 9, 2022.

BACKPLANE CONNECTOR ASSEMBLY WITH IMPROVED SHIELDING EFFECT

CROSS-REFERENCE TO RELATED APPLICATIONS

This patent application claims priority of a Chinese Patent Application No. 202010567796.4, filed on Jun. 19, 2020 and titled "Backplane connector assembly", and a Chinese Patent Application No. 202010823428.1, filed on Aug. 17, 2020 and titled "Backplane connector assembly", the entire content of which is incorporated herein by reference.

TECHNICAL FIELD

The present disclosure relates to a backplane connector assembly which belongs to a technical field of connectors.

BACKGROUND

Existing backplane connector assemblies usually include a male connector and a female connector. The male connector usually includes a male housing and a plurality of male terminal modules mounted to the male housing. Each male terminal module includes a first insulating bracket, a plurality of male conductive terminals insert-molded with the first insulating bracket, and a first metal shield located on at least one side of the first insulating bracket. The female connector usually includes a female housing and a plurality of female terminal modules mounted to the female housing. Each female terminal module includes a second insulating bracket, a plurality of female conductive terminals insert-molded with the second insulating bracket, and a second metal shield located on at least one side of the second insulating bracket.

When the male connector and the female connector are mated, the male conductive terminals and the female conductive terminals are in contact with each other, and the first metal shield and the second metal shield are mated with each other.

However, with the continuous improvement of the signal transmission requirements of high-speed connectors, there is still room for improvement in the shielding of the differential signal terminals of the existing backplane connector assemblies.

SUMMARY

An object of the present disclosure is to provide a backplane connector assembly with improved shielding effect.

In order to achieve the above object, the present disclosure adopts the following technical solution: a backplane connector assembly, comprising a first backplane connector and a second backplane connector for mating with the first backplane connector, the first backplane connector comprising a first terminal module, the first terminal module comprising: a plurality of first conductive terminals, each of the first conductive terminals comprising a first connection portion and a first contact portion; a first insulating bracket fixed with the first connection portion; a first metal shield comprising a first extension portion; and a second metal shield comprising a second extension portion; wherein the first conductive terminals comprise first differential signal terminals, a first ground terminal and a second ground terminal, and the first differential signal terminals are located between the first ground terminal and the second ground terminal; the second backplane connector comprising a second terminal module, the second terminal module comprising mating terminals for mating with the first differential signal terminals; wherein the first extension portion, the second extension portion, the first contact portion of the first ground terminal and the first contact portion of the second ground terminal jointly form a shielding space, and the first contact portions of the first differential signal terminals are located in the shielding space; and wherein the second terminal module comprises a shielding shell enclosing a periphery of the mating terminals, and the shielding shell is received in the shielding space.

Compared with the prior art, the second terminal module of the present disclosure includes a shielding shell surrounding a periphery of the mating terminals, and the shielding shell is received in the shielding space. This setting reduces crosstalk and improves the quality of signal transmission.

DETAILED DESCRIPTION

Figure 1:
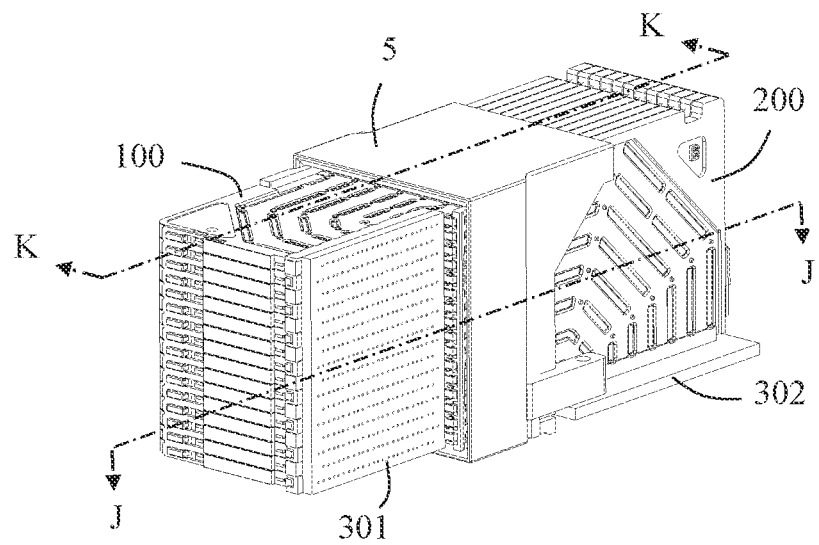
FIG. 1 is a perspective schematic view of a backplane connector assembly in accordance with an embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

First Embodiment

Figure 2:
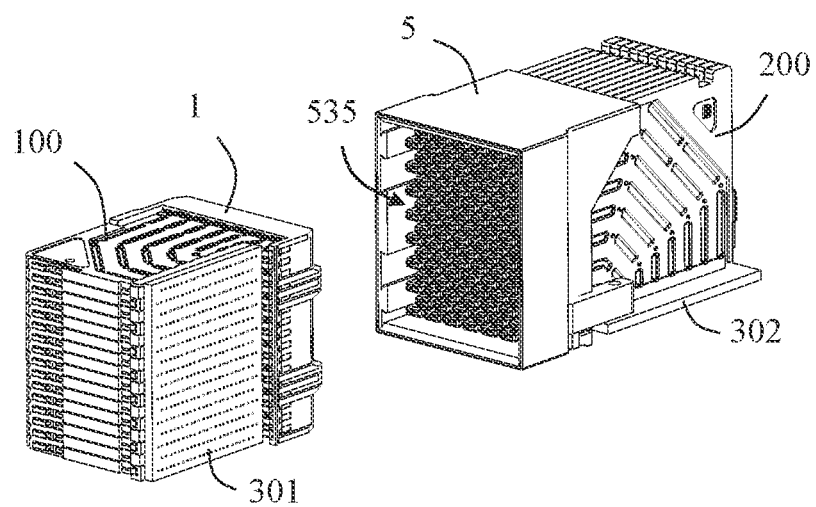
FIG. 2 is a partial perspective exploded view of FIG. 1.

Referring to FIGS. 1 and 2, an embodiment of the present disclosure discloses a backplane connector assembly which includes a first backplane connector 100, a second backplane connector 200 for mating with the first backplane connector 100, a first circuit board 301 mounted with the first backplane connector 100, and a second circuit board 302 mounted with the second backplane connector 200. In the illustrated embodiment of the present disclosure, the first backplane connector 100 and the second backplane connector 200 are mated in an orthogonal manner. The first circuit board 301 is perpendicular to the second circuit board 302.

Figure 3:
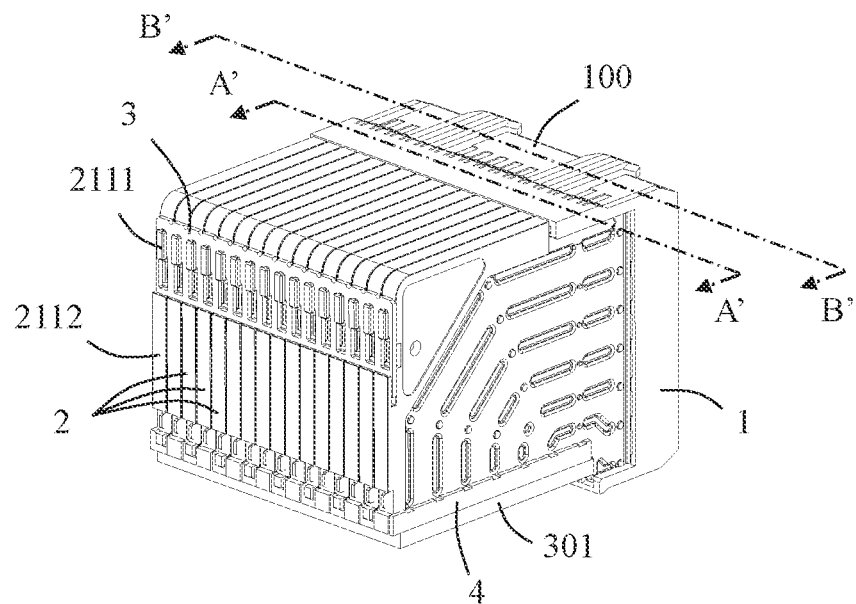
FIG. 3 is a perspective schematic view of a first backplane connector of the present disclosure when it is mounted on a first circuit board.
Figure 4:
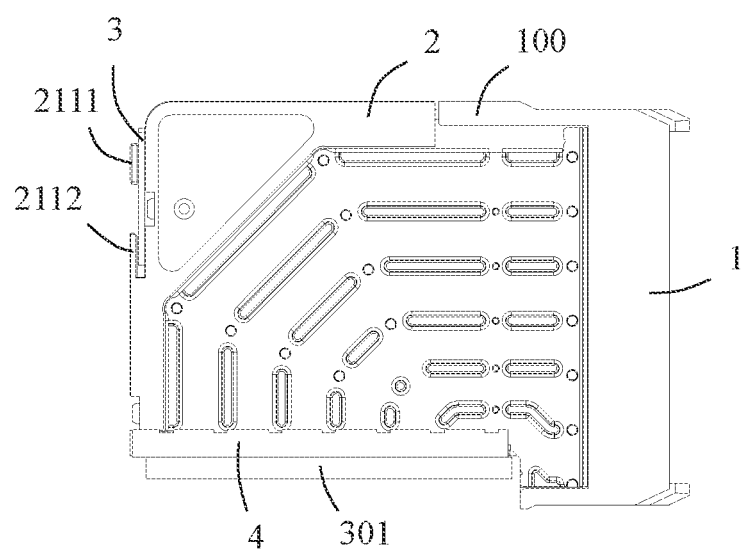
FIG. 4 is a front view of FIG. 3.

Referring to FIGS. 3 and 4, the first backplane connector 100 includes a first housing 1, a plurality of first terminal modules 2 assembled to the first housing 1, a first spacer 3 fixed at a rear end of the plurality of first terminal modules 2, and a first mounting block 4 mounted at a bottom end of the plurality of first terminal modules 2.

Figure 5:
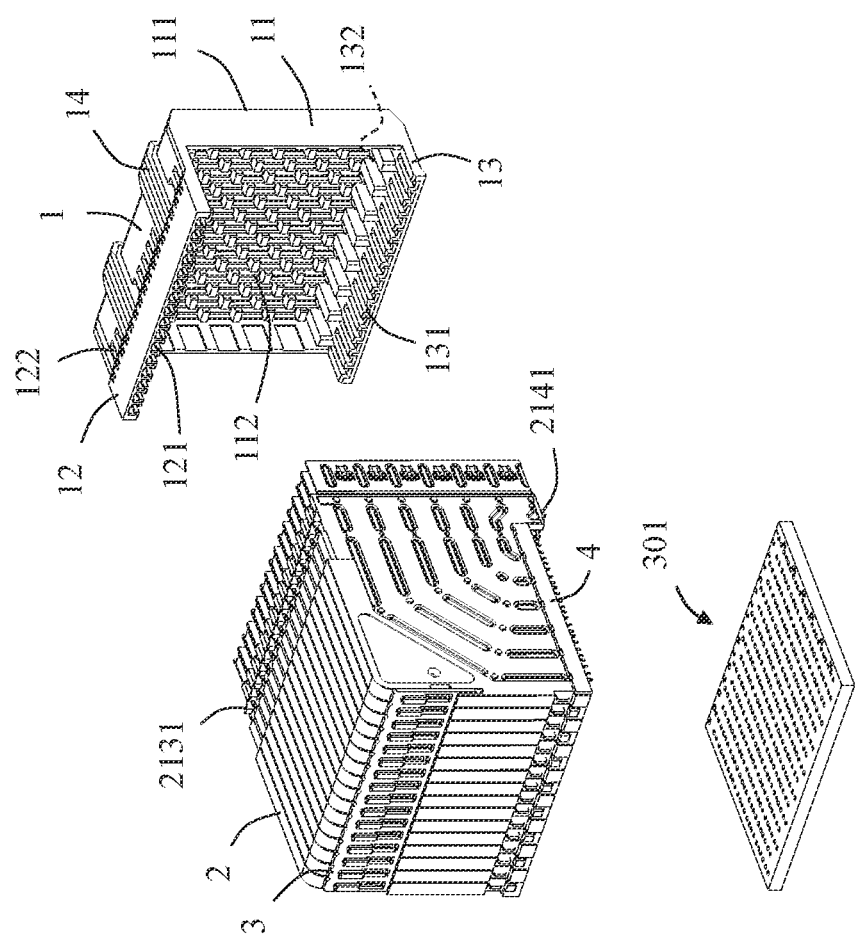
FIG. 5 is a partially exploded perspective view of FIG. 3.
Figure 6:
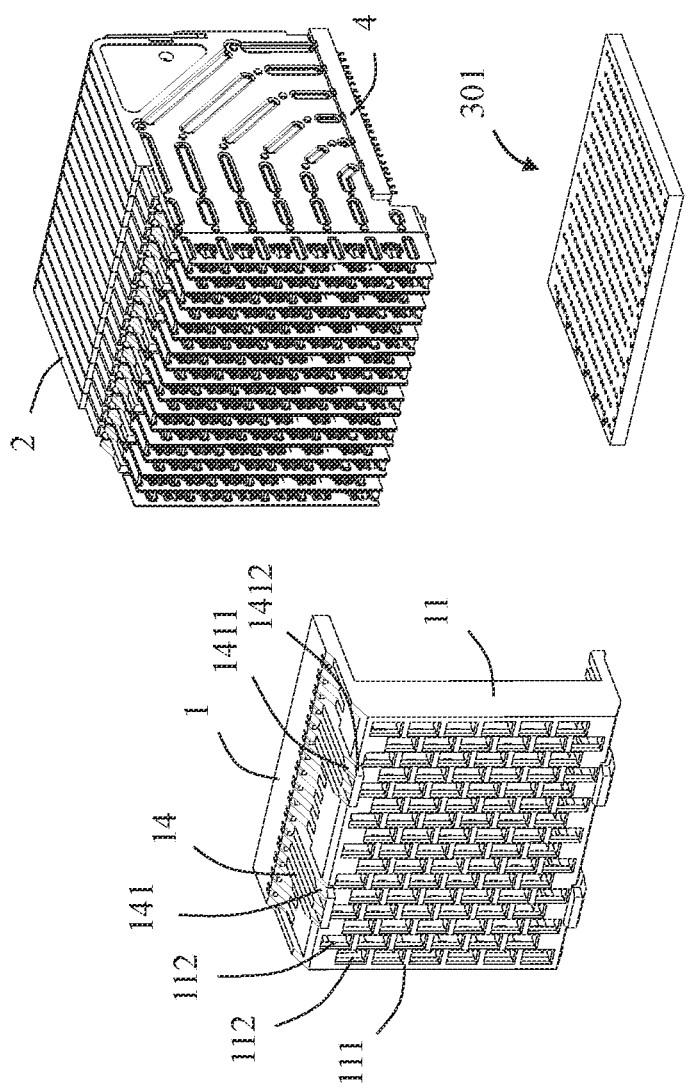
FIG. 6 is a partially exploded perspective view of FIG. 5 from another angle.

Referring to FIGS. 5 and 6, in an embodiment of the present disclosure, the first housing 1 is made of insulating material. The first housing 1 includes a first body portion 11, a first wall portion 12 extending rearwardly from one side of the first body portion 11, and a second wall portion 13 extending rearwardly from the other side of the first body portion 11. The first wall portion 12 and the second wall portion 13 are in parallel. The first body portion 11 includes a mating surface 111 and a plurality of first terminal receiving grooves 112 extending through the mating surface 111. In the illustrated embodiment of the present disclosure, the first terminal receiving grooves 112 are disposed in multiple rows along a left-right direction, wherein two adjacent rows of first terminal receiving grooves 112 are staggered in a vertical direction. That is, in two adjacent rows of first terminal receiving grooves 112, the first terminal receiving grooves 112 at corresponding positions are not in alignment in the left-right direction. The first wall portion 12 includes a plurality of first slots 121 and a plurality of first locking grooves 122 communicating with corresponding first slots 121. The second wall portion 13 includes a plurality of second slots 131 and a plurality of second locking grooves 132 communicating with corresponding second slots 131. The first locking grooves 122 and the second locking grooves 132 extend outwardly along the vertical direction through the first wall portion 12 and the second wall portion 13, respectively. The first locking grooves 122 and the second locking grooves 132 are adapted to lock with the first terminal modules 2 in order to prevent the first terminal modules 2 from being separated from the first housing 1. The first slot 121, the second slot 131 and the first terminal receiving grooves 112 which are in alignment with each other along the vertical direction are used to receive the same first terminal module 2.

Besides, referring to FIG. 6, the first housing 1 also includes a plurality of positioning protrusions 14 extending forwardly from the first wall portion 12 and the second wall portion 13, respectively. The positioning protrusions 14 protrude beyond the mating surface 111. Each positioning protrusion 14 includes a guiding inclined surface 141 formed at an end thereof. Referring to FIG. 6, in the illustrated embodiment of the present disclosure, the guiding inclined surface 141 includes a plurality of first guiding inclined surfaces 1411 located on the top and a plurality of second guiding inclined surfaces 1412 located on opposite sides.

Figure 7:
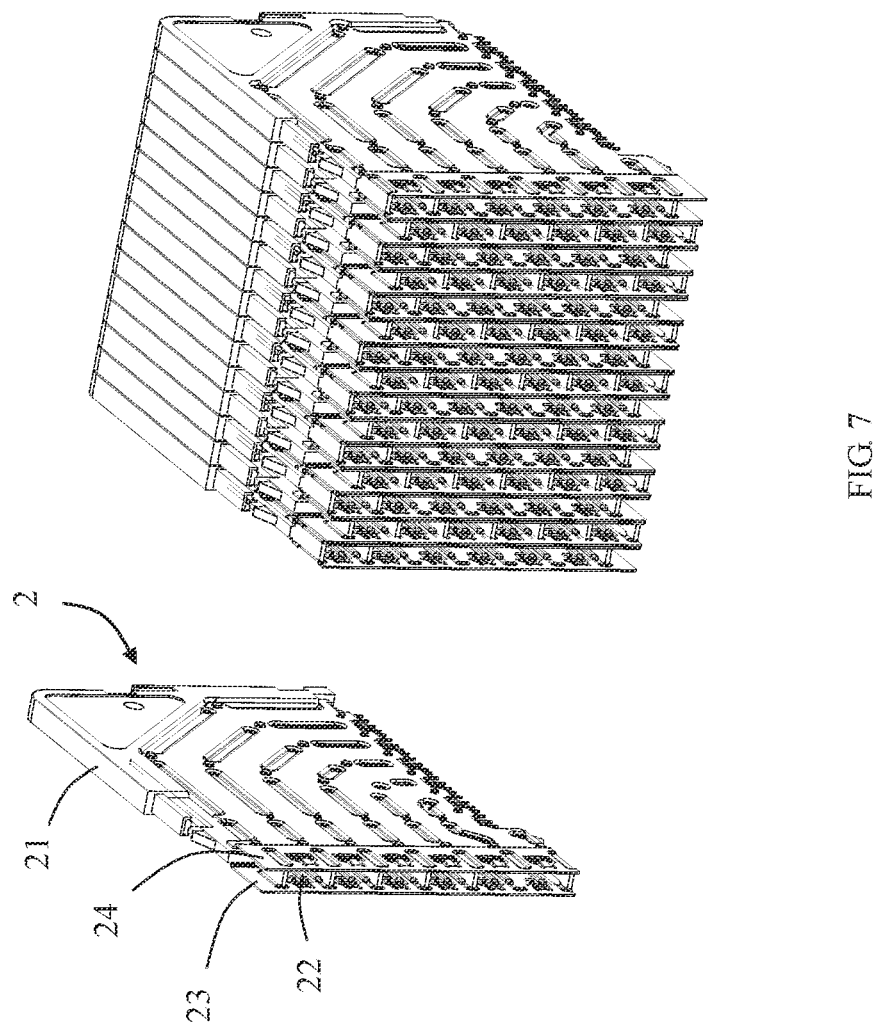
FIG. 7 is a partial perspective exploded view of the first backplane connector of the present disclosure, in which one of the first terminal modules is separated.

Referring to FIG. 7, the first terminal module 2 includes a first insulating bracket 21, a plurality of first conductive terminals 22 fixed to the first insulating bracket 21, a first metal shield 23 fixed on one side of the first insulating bracket 21, and a second metal shield 24 fixed on the other side of the first insulating bracket 21.

Figure 10:
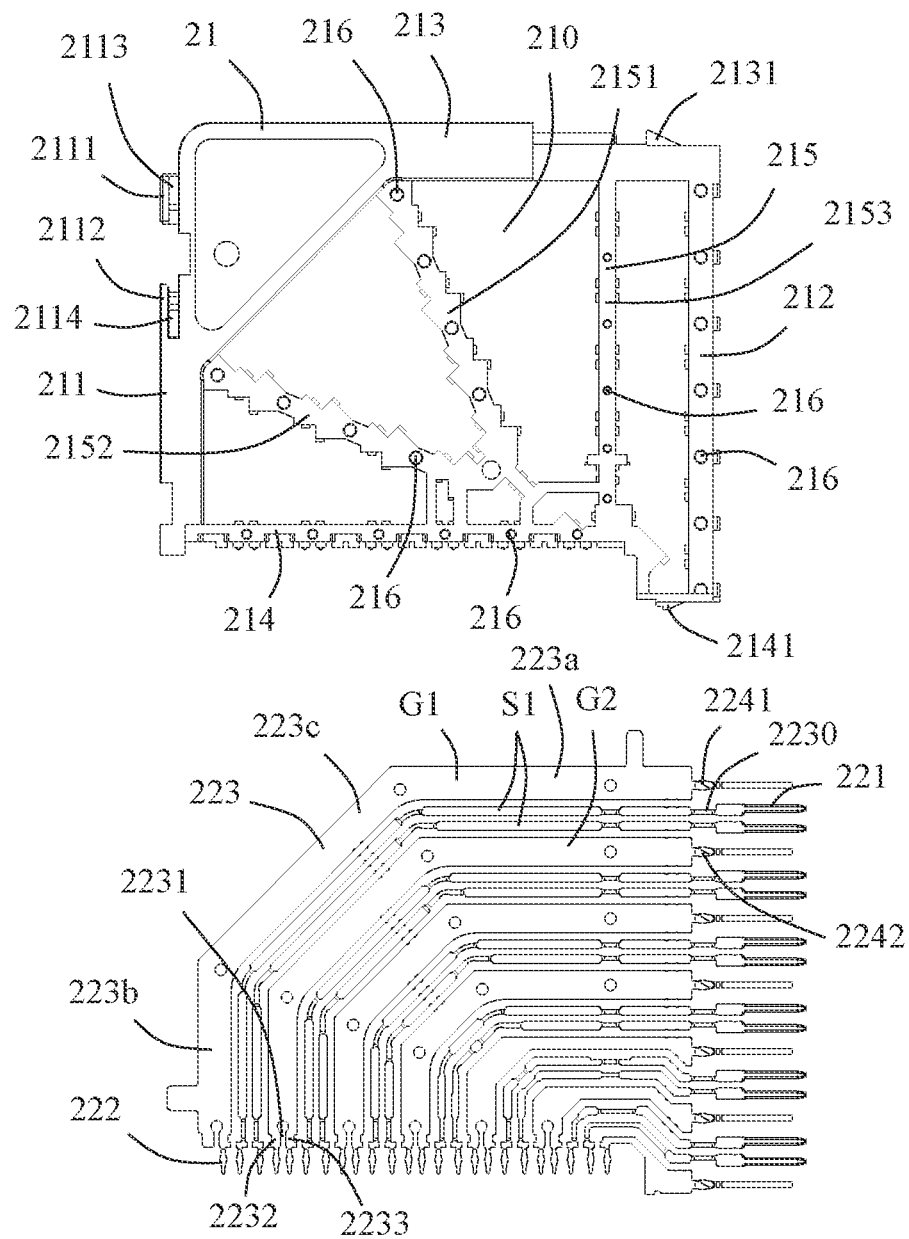
FIG. 10 is a side view of the first insulating bracket when separated from the first conductive terminals.

Referring to FIG. 10, each first insulating bracket 21 is roughly frame-shaped and includes a first rear wall 211, a first front wall 212 opposite to the first rear wall 211, a first top wall 213 connecting one end of the first rear wall 211 and one end of the first front wall 212, a first bottom wall 214 connecting the other end of the first rear wall 211 and the other end of the first front wall 212, and a plurality of connecting walls 215. The connecting walls 215 are capable of enhancing the structural strength of the frame. The first rear wall 211 includes a first protrusion 2111 and a second protrusion 2112 which protrude rearwardly. The first protrusion 2111 and the second protrusion 2112 are spaced apart from each other along the vertical direction. The first protrusion 2111 and the second protrusion 2112 are in alignment with each other along the vertical direction. The first protrusion 2111 includes a first constriction portion 2113, and the second protrusion 2112 includes a second constriction portion 2114. In the illustrated embodiment of the present disclosure, the first insulating bracket 21 includes a first hollow portion 210. The connecting walls 215 include a first connecting wall 2151 connecting the first top wall 213 and the first bottom wall 214, and a second connecting wall 2152 connecting the first rear wall 211 and the first bottom wall 214. The first connecting wall 2151 and the second connecting wall 2152 are arranged obliquely. One ends of the first connecting wall 2151 and the second connecting wall 2152 are close to each other, and the other ends are spread out to form a radial shape. The connecting wall 215 further includes a first reinforcing wall 2153 connecting the first top wall 213 and the first bottom wall 214. The first reinforcing wall 2153 is parallel to the first front wall 212. Referring to FIG. 10, a width of the first reinforcing wall 2153 is smaller than a width of the first front wall 212. The first connecting wall 2151 and the second connecting wall 2152 are exposed in the first hollow portion 210. The first top wall 213 includes a first locking protrusion 2131 for being inserted into the first locking groove 122. The first bottom wall 214 includes a second locking protrusion 2141 for being inserted into the second locking groove 132.

Figure 8:
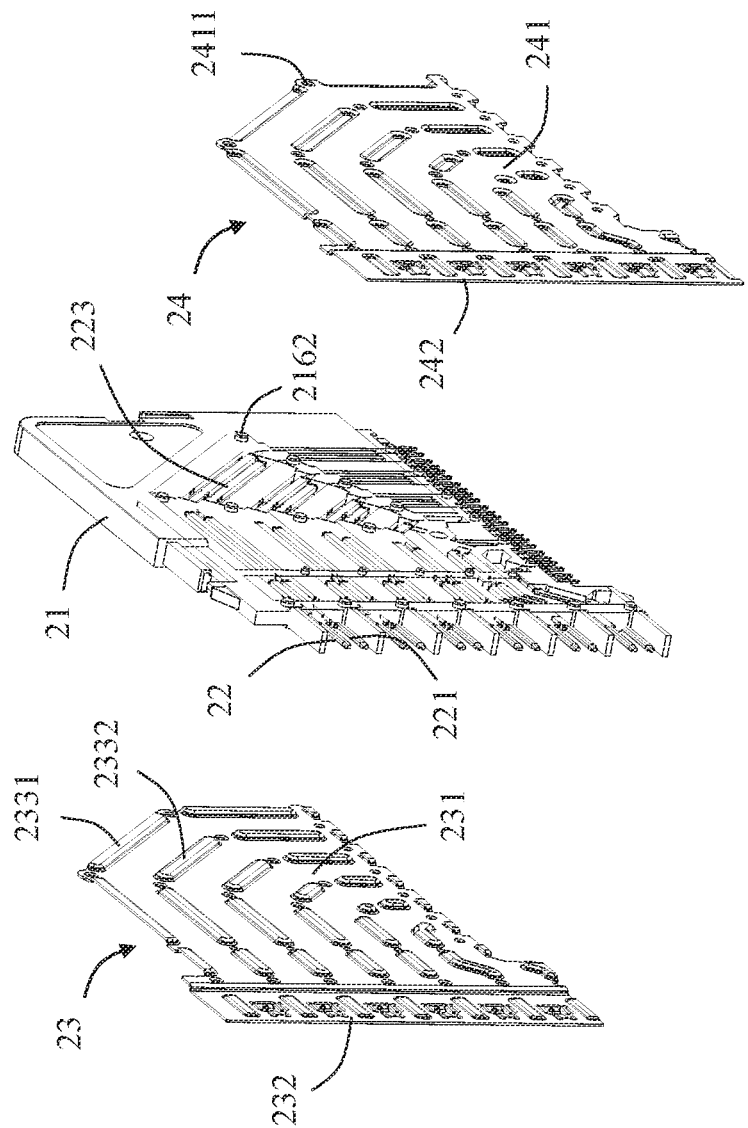
FIG. 8 is a partial perspective exploded view of the first terminal module in FIG. 7.
Figure 9:
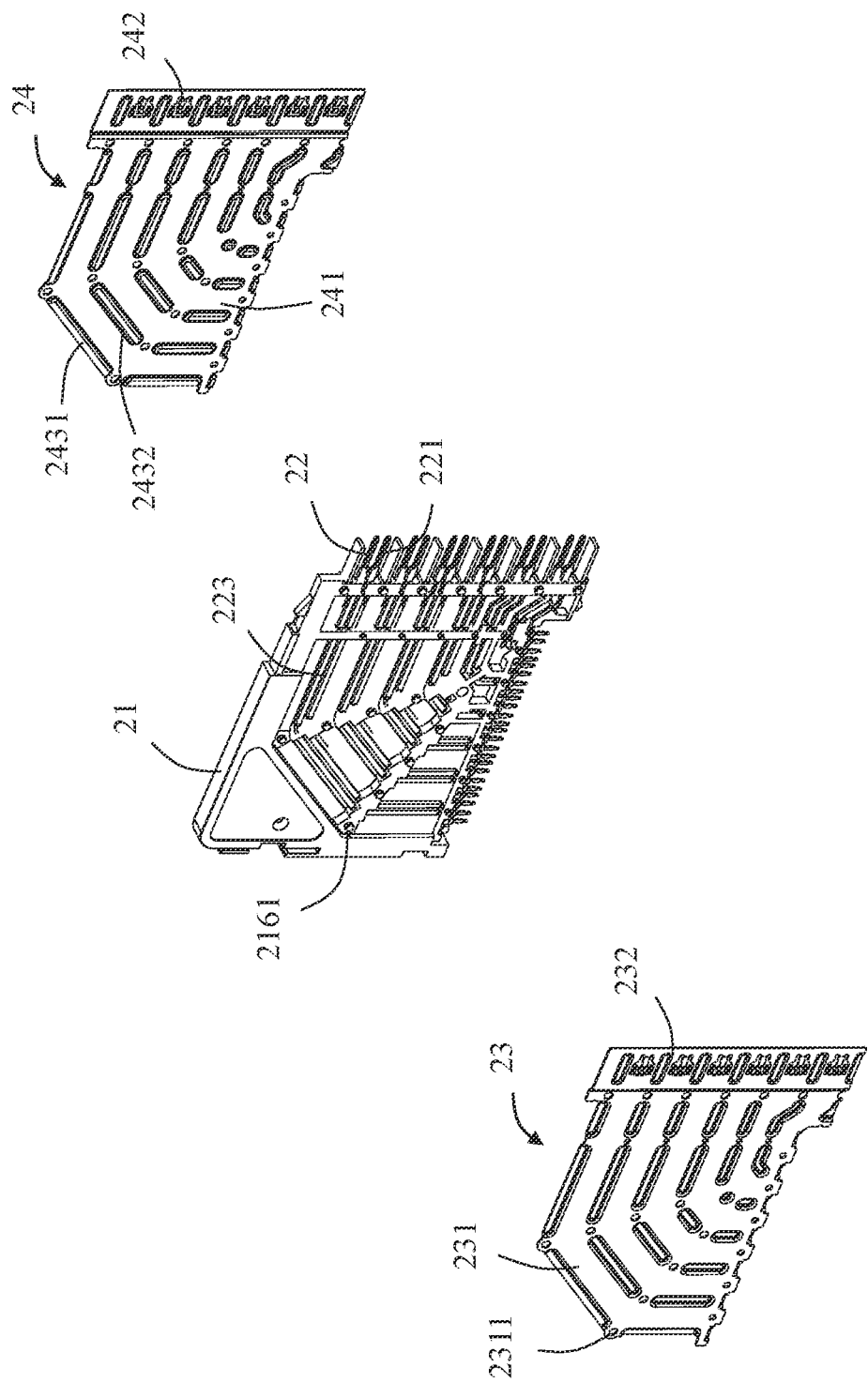
FIG. 9 is a partial perspective exploded view of FIG. 8 from another angle.

Referring to FIGS. 8 to 10, the first insulating bracket 21 further includes a plurality of posts 216 for fixing the first metal shield 23 and the second metal shield 24. In the illustrated embodiment of the present disclosure, the posts 216 are substantially cylindrical. In the illustrated embodiment of the present disclosure, the posts 216 are disposed on the first bottom wall 214, the first connecting wall 2151, the second connecting wall 2152, the first reinforcing wall 2153 and the first front wall 212. The first metal shield 23 and the second metal shield 24 are located on opposite sides of the first insulating bracket 21, respectively. The posts 216 include a plurality of first posts 2161 and a plurality of second posts 2162. The first posts 2161 and the second posts 2162 are located on opposite sides of the first insulating bracket 21, respectively, so as to be fixed and positioned with the first metal shield 23 and the second metal shield 24. The size of the posts 216 on the first reinforcing wall 2153 is smaller than the size of the posts 216 on the first connecting wall 2151, the second connecting wall 2152 and the first front wall 212.

Referring to FIG. 10, each first conductive terminal 22 includes a first contact portion 221, a first tail portion 222 and a first connection portion 223 connecting the first contact portion 221 and the first tail portion 222. Some of the first contact portions 221 are used to electrically connect with the second backplane connector 200. The first tail portions 222 are used for being mounted to the first circuit board 301. In the illustrated embodiment of the present disclosure, the first contact portion 221 is substantially perpendicular to the first tail portion 222. The first connection portion 223 is of a curved configuration. Specifically, the first connection portion 223 includes a first section 223a parallel to the first contact portion 221, a second section 223b parallel to the first tail portion 222, and a third section 223c connecting the first section 223a and the second section 223b. Referring to FIG. 10, the first section 223a extends horizontally. The second section 223b extends vertically. The third section 223c extends obliquely.

Each group of first conductive terminals 22 include a plurality of first ground terminals G1, a plurality of second ground terminals G2, and a plurality of first signal terminals S1. In the illustrated embodiment of the present disclosure, two adjacent first signal terminals S1 form a pair of first differential signal terminals. Each pair of first differential signal terminals are located between one first ground terminal G1 and one second ground terminal G2. That is, each group of first conductive terminals 22 are arranged in a manner of G1-S1-S1-G2, which is beneficial to improve the quality of signal transmission. The first differential signal terminals are narrow-side coupling or wide-side coupling. A width of the first ground terminal G1 and a width the second ground terminal G2 are greater than a width of each first signal terminal S1 which is located between the first ground terminal G1 and the second ground terminal G2. Therefore, it is beneficial to increase the shielding area and improve the shielding effect.

In the illustrated embodiment of the present disclosure, the first connection portions 223 of the first conductive terminals 22 are partially insert-molded with the first insulating bracket 21. The first connection portions 223 of the first differential signal terminals, the first connection portion 223 of the first ground terminal G1, and the first connection portion 223 of the second ground terminal G2 are all exposed to the same first hollow portion 210. Each first connection portion 223 of the first signal terminal S1 has a narrowed portion 2230 insert-molded with the first insulating bracket 21 so as to adjust the impedance of the first signal terminal S1 for achieving impedance matching. In the illustrated embodiment of the present disclosure, the first contact portion 221 of the first signal terminal S1 is substantially needle-shaped. The first contact portion 221 of the first ground terminal G1 and the first contact portion 221 of the second ground terminal G2 are substantially rectangular-shaped. The first contact portion 221 of the first signal terminal S1 and the first connection portion 223 of the first conductive terminal 22 are both coplanar, which means they are located in a same first plane (for example, a horizontal plane). It should be noted that the technical term "coplanar" used in the present disclosure is intended to indicate that related components are substantially flush, which includes situations of incomplete coplanarity caused by manufacturing tolerances. In the illustrated embodiment of the present disclosure, the first ground terminal G1 includes a first torsion portion 2241 connecting its first contact portion 221 and its first tail portion 222, so that the first contact portion 221 of the first ground terminal G1 is located in a second plane (for example, a vertical plane) perpendicular to the first plane. The second ground terminal G2 includes a second torsion portion 2242 connecting its first contact portion 221 and its first tail portion 222, so that the first contact portion 221 of the second ground terminal G2 is also located in the second plane (for example, the vertical plane) perpendicular to the first plane. The first contact portion 221 of the first ground terminal G1 and the first contact portion 221 of the second ground terminal G2 are parallel to each other. Each first connection portion 223 of the first ground terminals G1 and the second ground terminals G2 further includes a slot 2231 adjacent to its corresponding first tail portion 222. The slot 2231 extend through a bottom edge of the first connection portion 223, so that the first connection portions 223 is divided into a first end portion 2232 and a second end portion 2233.

Figure 15:
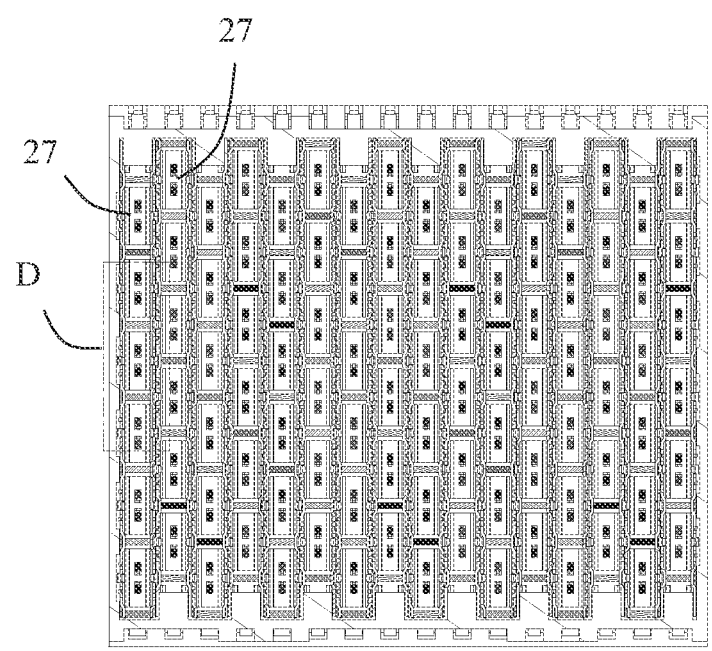
FIG. 15 is a schematic cross-sectional view taken along the line B'-B' in FIG. 3.
Figure 16:
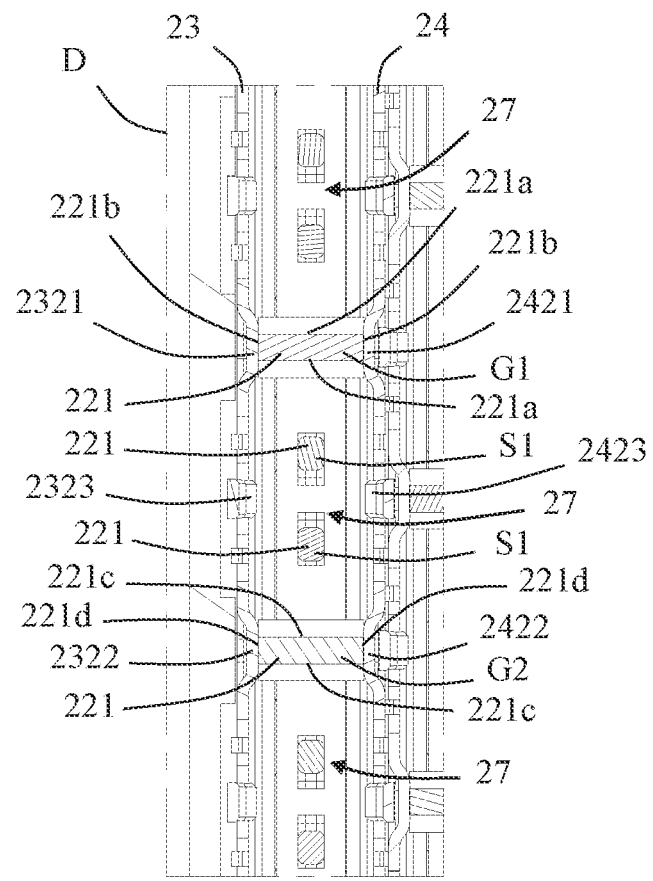
FIG. 16 is a partial enlarged view of a frame part D in FIG. 15.

Referring to FIGS. 15 and 16, in the illustrated embodiment of the present disclosure, the first contact portion 221 and the first connection portion 223 of the first ground terminal G1 have a first wide surface 221a and a first narrow surface 221b perpendicular to the first wide surface 221a. The first contact portion 221 and the first connection portion 223 of the second ground terminal G2 have a second wide surface 221c and a second narrow surface 221d perpendicular to the second wide surface 221c. The first connection portions 223 of each pair of first differential signal terminals are located between the first narrow surface 221b of the first ground terminal G1 and the second narrow surface 221d of the second ground terminal G2 which are located on opposite sides of the first connection portions 223 of each pair of first differential signal terminals. The first contact portions 221 of each pair of first differential signal terminals are located between the first wide surface 221a of the first ground terminal G1 and the second wide surface 221c of the second ground terminal G2 which are located on opposite sides of the first contact portions 221 of each pair of first differential signal terminals. In the illustrated embodiment of the present disclosure, a width of the first wide surface 221a and a width of the second wide surface 221c are greater than a width of each first contact portion 221 of the first signal terminals S1, thereby better shielding can be provided for the first contact portions 221 of the first signal terminals S1.

Figure 11:
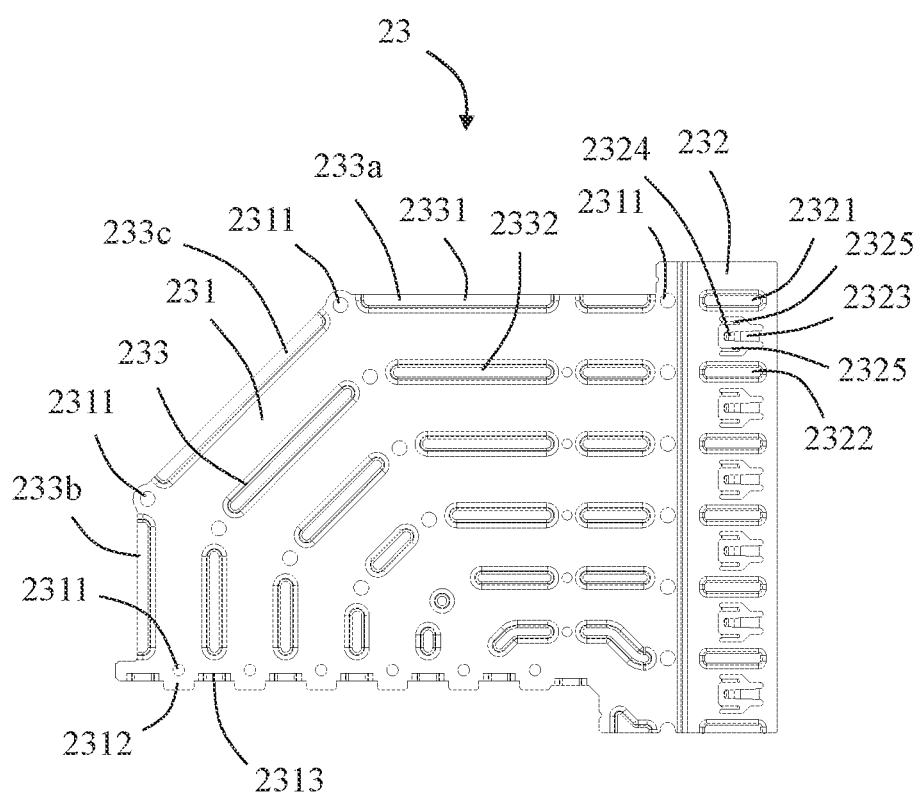
FIG. 11 is a side view of a first metal shield of the first backplane connector.

In the illustrated embodiment of the present disclosure, the first metal shield 23 and the second metal shield 24 are symmetrically disposed on opposite sides of the first insulating bracket 21. Referring to FIGS. 9 and 11, the first metal shield 23 includes a first main body portion 231 and a first extension portion 232 extending from the first main body portion 231. The first main body portion 231 is located on one side of the first connection portions 223 of the first conductive terminals 22. The first extension portion 232 is located on one side of the first contact portions 221 of the first conductive terminals 22. In the illustrated embodiment of the present disclosure, the first extension portion 232 and the first main body portion 231 are located in different planes, in which the first extension portion 232 is farther away from the second metal shield 24 than the first main body portion 231. The first main body portion 231 includes a plurality of first mounting holes 2311 for mating with the plurality of first posts 2161. The first posts 2161 are fixed and positioned in the first mounting holes 2311 by soldering, thereby the fixing and positioning of the first metal shield 23 and the first insulating bracket 21 are realized. The first main body 231 includes a plurality of ribs 233. The ribs 233 include a plurality of first ribs 2331 protruding toward the first ground terminals G1 and a plurality of second ribs 2332 protruding toward the second ground terminals G2. The first ribs 2331 corresponding to the first ground terminal G1 are disposed along an extending direction of the first connection portion 223 of the first ground terminal G1. The second ribs 2332 corresponding to the second ground terminal G2 are disposed along an extending direction of the first connection portion 223 of the second ground terminal G2. In the illustrated embodiment of the present disclosure, the first ribs 2331 and the second ribs 2332 are formed by stamping the first main body portion 231. The first ribs 2331 and the second ribs 2332 protrude toward the second metal shield 24. The first ribs 2331 and the second ribs 2332 are discontinuously disposed along the extending direction of the first connection portion 223 of the first ground terminal G1 and the extending direction of the first connection portion 223 of the second ground terminal G2, respectively, so as to achieve multi-position contact. In order to improve the reliability of the contact between the first metal shield 23 and the first ground terminals G1 and the second ground terminals G2. In the illustrated embodiment of the present disclosure, referring to FIG. 14, a wall thickness of the first rib 2331, a wall thickness of the second rib 2332, and a wall thickness of a portion of the first main body 231 located between the first rib 2331 and the second rib 2332 are the same. Specifically, each of the first rib 2331 and the second rib 2332 includes a first rib section 233a parallel to the first contact portion 221, a second rib section 233b parallel to the first tail portion 222, and a third rib section 233c connecting the first rib section 233a and the second rib section 233b. Referring to FIG. 11, the first rib section 233a extends horizontally. The second rib section 233b extends vertically. The third rib section 233c extends obliquely. The first rib section 233a, the second rib section 233b and the third rib section 233c correspond to the first section 223a, the second section 223b and the third section 223c of the first ground terminal G1 and the second ground terminal G2, respectively.

The first extension portion 232 includes a plurality of first bulges 2321 protruding toward the corresponding first contact portions 221 of the first ground terminals G1, a plurality of second bulges 2322 protruding toward the corresponding first contact portions 221 of the second ground terminals G2, and a plurality of first elastic pieces 2323 each of which is located between adjacent first bulge 2321 and second bulge 2322. The first elastic pieces 2323 extend along directions toward the first main body portion 231. Each first elastic piece 2323 has an arc-shaped contact portion 2324. In the illustrated embodiment of the present disclosure, the first extension portion 232 further includes two first protruding tabs 2325 located at opposite sides of each first elastic piece 2323. The first protruding tabs 2325 and the first elastic pieces 2323 extend along opposite directions. The first protruding tabs 2325 protrude sidewardly to contact the adjacent first terminal module 2 so as to improve the shielding effect. In the illustrated embodiment of the present disclosure, referring to FIG. 16, a wall thickness of the first bulge 2321, a wall thickness of the second bulge 2322 and a wall thickness of a portion of the first extension portion 232 located between the first bulge 2321 and the second bulge 2322 are the same.

In addition, the first main body portion 231 further includes a plurality of first protruding pieces 2312 extending downwardly from a bottom edge thereof and a plurality of connecting pieces 2313 each of which is located between two adjacent first protruding pieces 2312. By providing the first protruding pieces 2312, the shielding length can be extended, and the shielding effect of the first signal terminals S1 can be improved. In the illustrated embodiment of the present disclosure, the connecting pieces 2313 are stamped from the first main body portion 231. Each connecting piece 2313 straddles the corresponding slot 2231 to connect one side of the first end portion 2232 and the second end portion 2233 of the same first ground terminal G1, thereby improving the shielding effect. At the same time, each connecting piece 2313 can also connect one side of the first end portion 2232 and the second end portion 2233 of the same second ground terminal G2, thereby improving the shielding effect.

Figure 12:
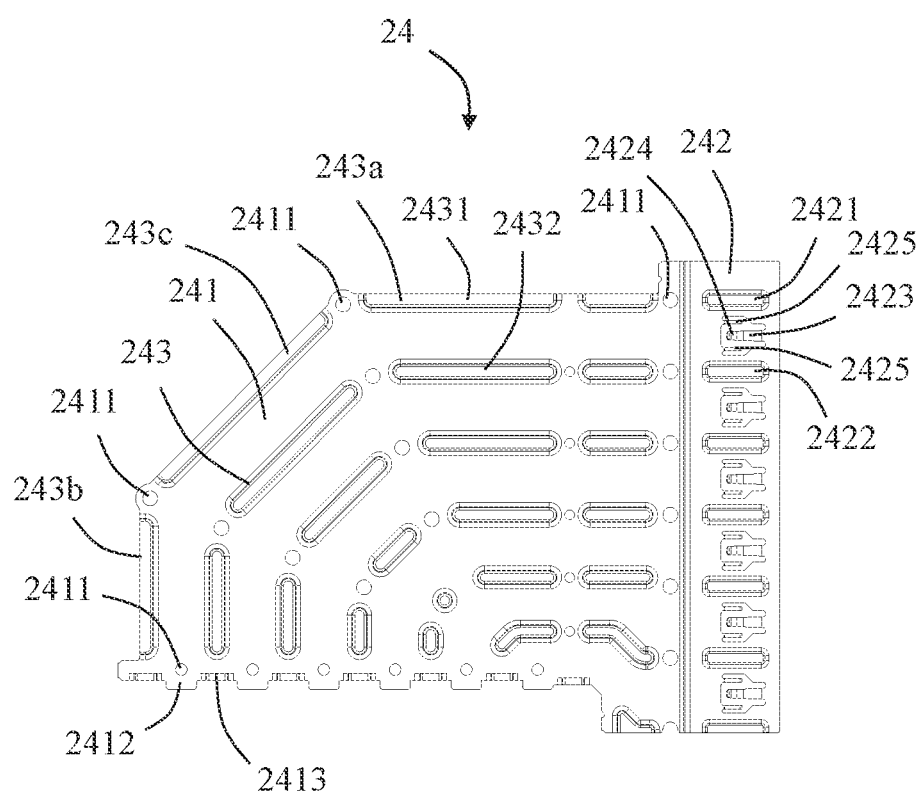
FIG. 12 is a side view of a second metal shield of the first backplane connector.

Similarly, referring to FIGS. 8 and 12, the second metal shield 24 includes a second main body portion 241 and a second extension portion 242 extending from the second main body portion 241. The second main body portion 241 is located on the other side of the first connection portions 223 of the first conductive terminals 22. The second extension portion 242 is located on the other side of the first contact portions 221 of the first conductive terminals 22. In the illustrated embodiment of the present disclosure, the second extension portion 242 and the second main body portion 241 are located in different planes, in which the second extension portion 242 is farther away from the first metal shield 23 than the second main body portion 241. The second main body portion 241 includes a plurality of second mounting holes 2411 for mating with the plurality of second posts 2162. The second posts 2162 are fixed and positioned in the second mounting holes 2411 by soldering, so as to realize the fixing and positioning of the second metal shield 24 and the first insulating bracket 21. The second main body 241 includes a plurality of ribs 243. The ribs 243 include a plurality of third ribs 2431 protruding toward the first ground terminals G1 and a plurality of fourth ribs 2432 protruding toward the second ground terminals G2. The third ribs 2431 are disposed along the extending direction of the first connection portion 223 of the first ground terminal G1. The fourth ribs 2432 are disposed along the extending direction of the first connection portion 223 of the second ground terminal G2. In the illustrated embodiment of the present disclosure, the third ribs 2431 and the fourth ribs 2432 are formed by stamping the second main body portion 241. The third ribs 2431 and the fourth ribs 2432 protrude toward the first metal shield 23. The third ribs 2431 and the fourth ribs 2432 are discontinuously disposed along the extending direction of the first connection portion 223 of the first ground terminal G1 and the extending direction of the first connection portion 223 of the second ground terminal G2, respectively, so as to achieve multi-position contact. As a result, the reliability of the contact between the second metal shield 24 and the first ground terminals G1 and the second ground terminals G2 is improved. In the illustrated embodiment of the present disclosure, a wall thickness of the third rib 2431, a wall thickness of the fourth rib 2432 and a wall thickness of a portion of the second main body 241 located between the third rib 2431 and the fourth rib 2432 are the same. Specifically, each of the third rib 2431 and the fourth rib 2432 includes a first rib section 243a parallel to the first contact portion 221, a second rib section 243b parallel to the first tail portion 222, and a third rib section 243c connecting the first rib section 243a and the second rib section 243b. Referring to FIG. 12, the first rib section 243a extends horizontally. The second rib section 243b extends vertically. The third rib section 243c extends obliquely. The first rib section 243a, the second rib section 243b and the third rib section 243c correspond to the first section 223a, the second section 223b and the third section 223c of the first ground terminal G1 and the second ground terminal G2, respectively. In an embodiment of the present disclosure, soldering is performed on the surfaces of the ribs 233 and the ribs 243 to solder the ribs 233 and the ribs 243 to the first ground terminals G1 and the second ground terminals G2. For example, soldering is performed on the surfaces of the first ribs 2331, the second ribs 2332, the third ribs 2431 and the fourth ribs 2432 in order to solder the first ribs 2331, the second ribs 2332, the third ribs 2431 and the fourth rib 2432 to the first ground terminals G1 and the second ground terminals G2. The soldering method is at least one of spot soldering, laser soldering and ultrasonic soldering.

The second extension portion 242 includes a plurality of third bulges 2421 protruding toward the first contact portions 221 of the first ground terminals G1, a plurality of fourth bulges 2422 protruding toward the first contact portions 221 of the second ground terminals G2, and a plurality of second elastic pieces 2423 each of which is located between adjacent third bulge 2421 and fourth bulge 2422. The second elastic pieces 2423 extend along directions toward the second main body portion 241. Each second elastic piece 2423 has an arc-shaped contact portion 2424. In the illustrated embodiment of the present disclosure, the second extension portion 242 further includes two second protruding tabs 2425 located at opposite sides of each second elastic piece 2423. The second protruding tabs 2425 and the second elastic pieces 2423 extend along opposite directions. The second protruding tabs 2425 protrude sidewardly to contact the adjacent first terminal module 2 so as to improve the shielding effect. In the illustrated embodiment of the present disclosure, a wall thickness of the third bulge 2421, a wall thickness of the fourth bulge 2422, and a wall thickness of a portion of the second extension portion 242 located between the third bulge 2421 and the fourth bulge 2422 are the same.

In addition, the second main body portion 241 further includes a plurality of second protruding pieces 2412 extending downwardly from a bottom edge thereof, and a plurality of connecting pieces 2413 each of which is located between two adjacent second protruding pieces 2412. By providing the second protruding pieces 2412, the shielding length can be extended, and the shielding effect on the first signal terminals S1 can be improved. In the illustrated embodiment of the present disclosure, the connecting pieces 2413 are stamped from the second main body portion 241, and the connecting piece 2413 straddles the corresponding slot 2231 so as to connect the other side of the first end portion 2232 and the second end portion 2233 of the same first ground terminal G1 so as to improve the shielding effect. At the same time, the connecting piece 2413 can also connect the other side of the first end portion 2232 and the second end portion 2233 of the same second ground terminal G2 so as to improve the shielding effect.

Figure 13:
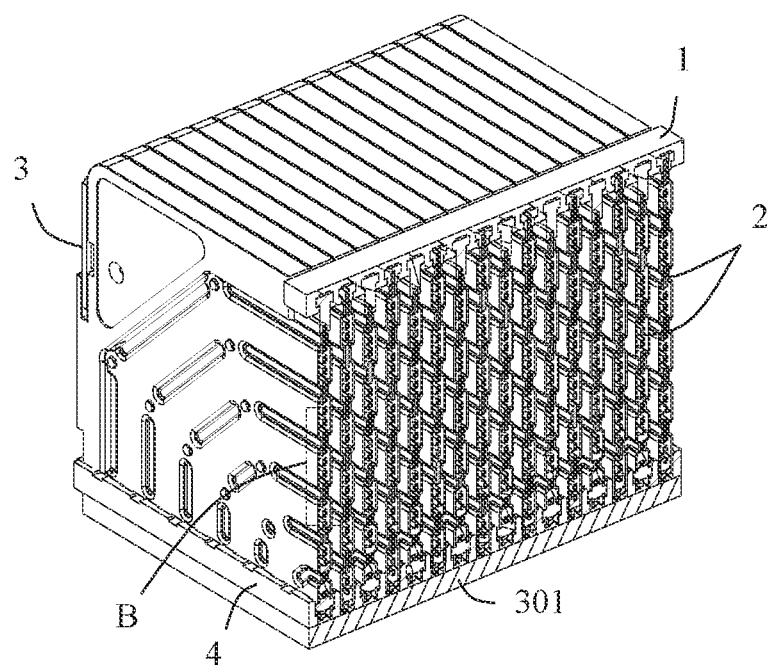
FIG. 13 is a partial perspective cross-sectional view taken along the line A'-A' in FIG. 3.
Figure 14:
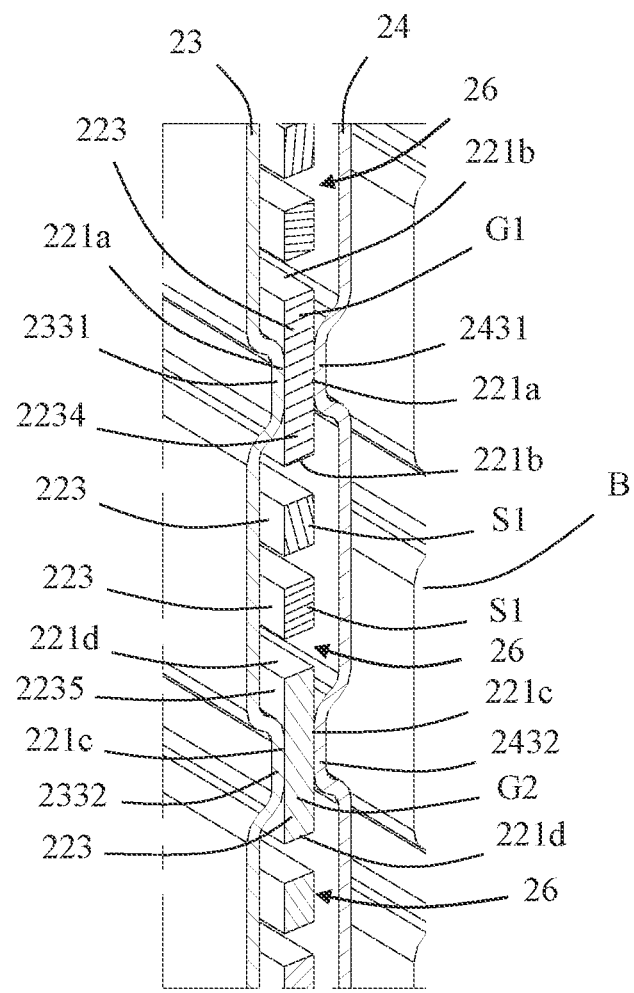
FIG. 14 is a partial enlarged view of a frame part B in FIG. 13.

Referring to FIGS. 13 and 14, along a length of the first connection portion 223 of the first conductive terminal 22, the first rib 2331 of the first metal shield 23 and the third rib 2431 of the second metal shield 24 respectively contact two opposite sides of the first connection portion 223 of the first ground terminal G1, and the second rib 2332 of the first metal shield 23 and the fourth rib 2432 of the second metal shield 24 respectively contact two opposite sides of the first connection portion 223 of the second ground terminal G2, thereby forming a shielding cavity 26 surrounding the outer periphery of the first connection portions 223 of each pair of first differential signal terminals. In the illustrated embodiment of the present disclosure, the first rib 2331 and the third rib 2431 respectively contact the first wide surface 221a of the first connection portion 223 of the first ground terminal G1. The second rib 2332 and the fourth rib 2432 respectively contact the second wide surface 221c of the first connection portion 223 of the second ground terminal G2. In the illustrated embodiment of the present disclosure, the shielding cavity 26 is jointly formed by the first main body portion 231, the second main body portion 241, the first ground terminal G1 and the second ground terminal G2. The first connection portion 223 of the first ground terminal G1 includes a first tab portion 2234 protruding into the shielding cavity 26. The first connection portion 223 of the second ground terminal G2 includes a second tab portion 2235 protruding into the shielding cavity 26. The first connection portions 223 of the first differential signal terminals are located between the first tab portion 2234 and the second tab portion 2235. In the illustrated embodiment of the present disclosure, there are a plurality of the shielding cavities 26 which are disposed along an arrangement direction of each group of the first conductive terminals 22. Two adjacent shielding cavities 26 share a single first ground terminal G1 or a single second ground terminal G2. In addition, a part of the shared first ground terminal G1 protrudes into one shielding cavity 26, and another part of the shared first ground terminal G1 protrudes into another shielding cavity 26.

Referring to FIG. 16, in the length of the first contact portion 221 of the first conductive terminal 22, the first bulge 2321 of the first metal shield 23 and the third bulge 2421 of the second metal shield 24 respectively contact two opposite side surfaces of the first contact portion 221 of the first ground terminal G1, and the second bulge 2322 of the first metal shield 23 and the fourth bulge 2422 of the second metal shield 24 respectively contact two opposite side surfaces of the first contact portion 221 of the second ground terminal G2. In the illustrated embodiment of the present disclosure, the first bulge 2321 of the first metal shield 23 and the third bulge 2421 of the second metal shield 24 respectively contact the first narrow surfaces 221b of the first contact portion 221 of the first ground terminal G1. The second bulge 2322 of the first metal shield 23 and the fourth bulge 2422 of the second metal shield 24 respectively contact the second narrow surfaces 221d of the first contact portion 221 of the second ground terminal G2. The first extension portion 232, the second extension portion 242, the first ground terminal G1 and the second ground terminal G2 jointly form a shielding space 27 for accommodating the corresponding first contact portions 221 of the first differential signal terminals. The first elastic piece 2323 and the second elastic piece 2423 extend into the shielding space 27. In the illustrated embodiment of the present disclosure, there are multiple shielding spaces 27 which are disposed along a stacking direction of each group of the first conductive terminals 22. Two adjacent shielding spaces 27 share a single first ground terminal G1 or a single second ground terminal G2. One first wide surface 221a of the first contact portion 221 of the shared first ground terminal G1 is exposed to the shielding space 27, and the other first wide surface 221a of the first contact portion 221 of the shared first ground terminal G1 is exposed to an adjacent shielding space 27. Similarly, a first wide surface 221c of the first contact portion 221 of the shared second ground terminal G2 is exposed to the adjacent shielding space 27, and the other wide surface 221c of the first contact portion 221 of the shared second ground terminal G2 is exposed to another adjacent shielding space 27.

In the illustrated embodiment of the present disclosure, there are multiple first terminal modules 2 of the first backplane connector 100, and the terminal arrangement of two adjacent first terminal modules 2 are staggered. Correspondingly, the shielding cavities 26 at the same position of two adjacent first terminal modules 2 are staggered, and the shielding spaces 27 at the same position of two adjacent first terminal modules 2 are staggered (referring to FIG. 15).

Figure 17:
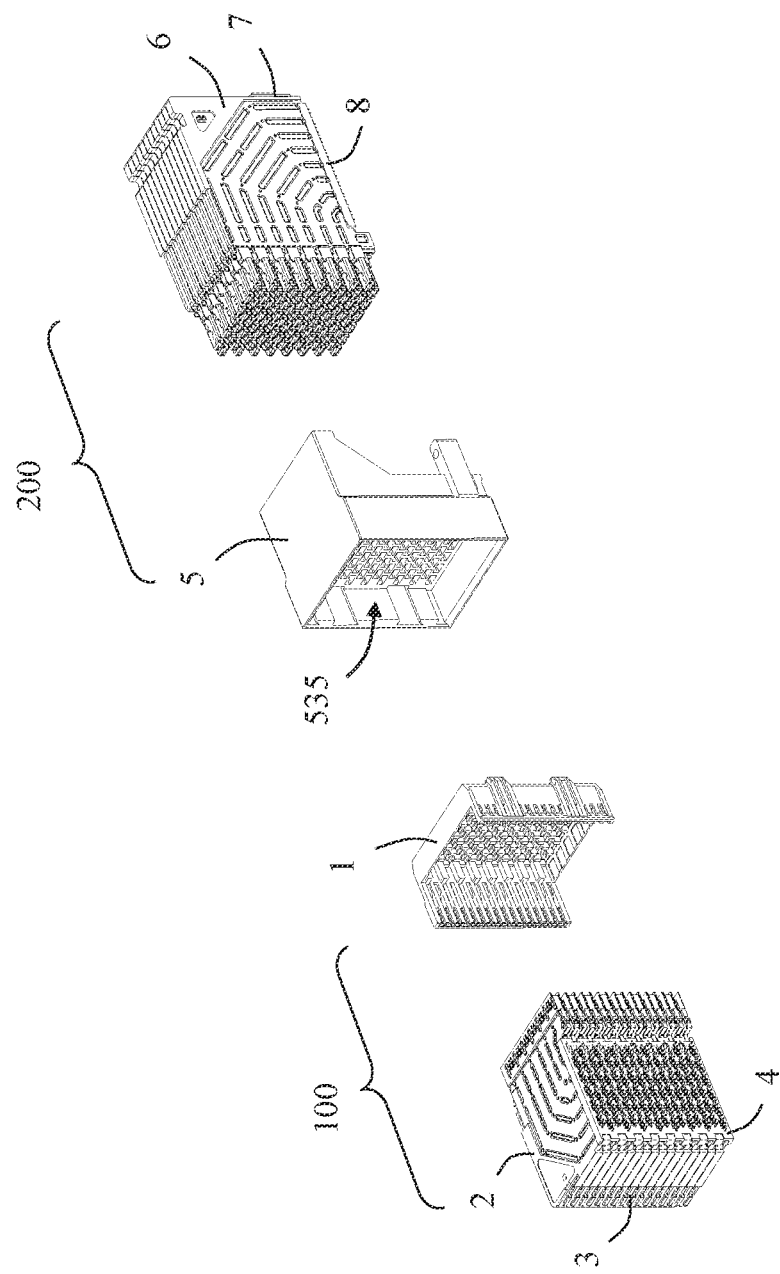
FIG. 17 is a further perspective exploded view of FIG. 2.

Referring to FIG. 17, the second backplane connector 200 includes a second header 5, a plurality of second terminal modules 6 assembled to the second header 5, a second spacer 7 holding on one side of the plurality of second terminal modules 6, and a second mounting block 8 holding the other side of the plurality of second terminal modules 6. The second header 5 includes a receiving space 535 for at least partially receiving the first backplane connector 100.

Figure 18:
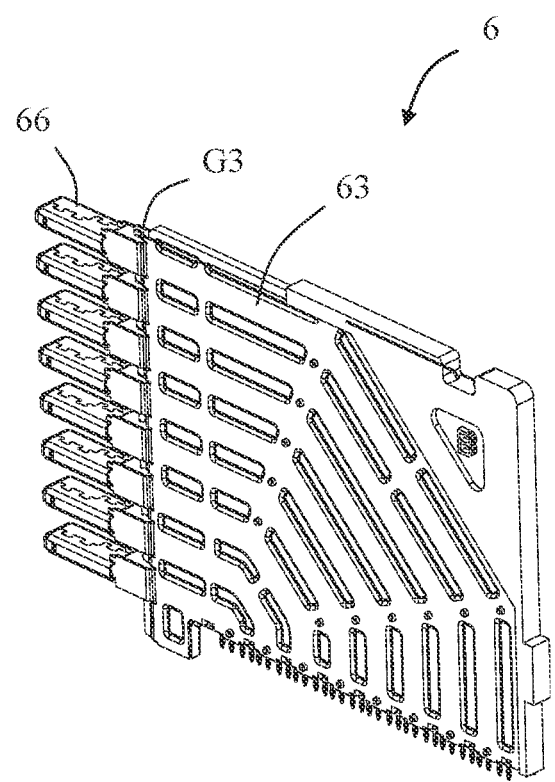
FIG. 18 is a perspective schematic view of a second terminal module of a second backplane connector.
Figure 19:
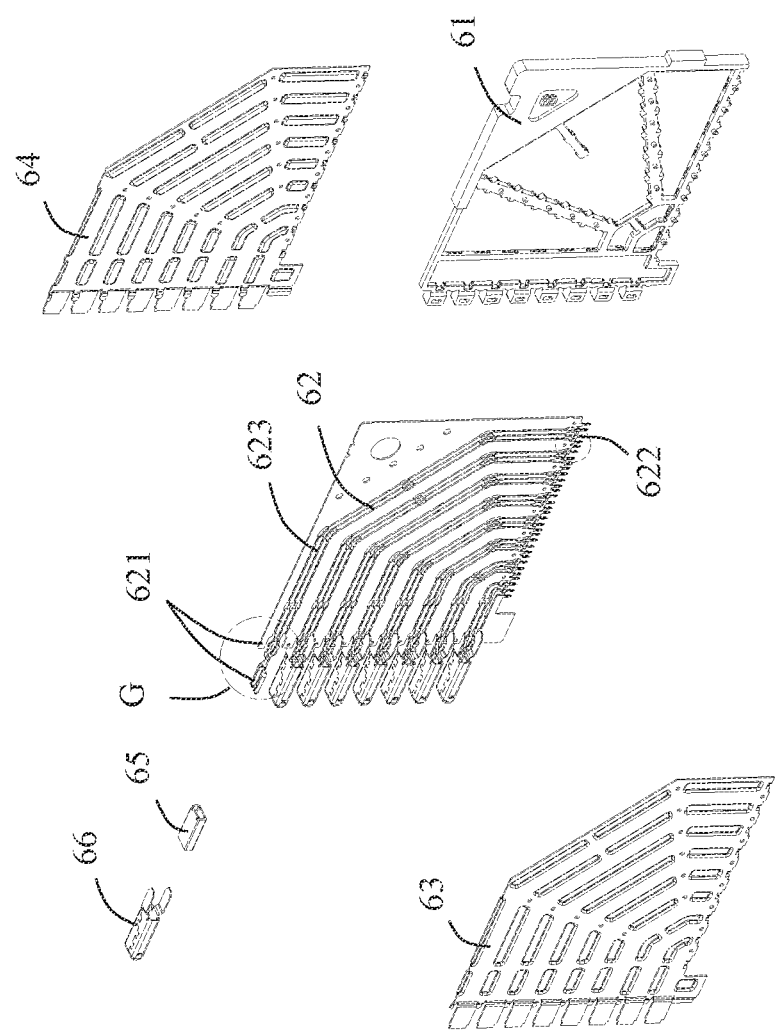
FIG. 19 is a partially exploded perspective view of FIG. 18.

Referring to FIGS. 18 and 19, each second terminal module 6 includes a second insulating bracket 61, a plurality of second conductive terminals 62 insert-molded with the second insulating bracket 61, a third metal shield 63 fixed on one side of the second insulating bracket 61, and a fourth metal shield 64 fixed on the other side of the second insulating bracket 61.

Each of second conductive terminals 62 includes a second contact portion 621, second tail portion 622, and a second connection portion 623 connecting the second contact portion 621 and the second tail portion 622. Some of the second contact portions 621 are used to electrically connect with the first backplane connector 100. The second tail portions 622 are used to be mounted to the second circuit board 302. In the illustrated embodiment of the present disclosure, the second contact portion 621 is substantially perpendicular to the second tail portion 622. The second connection portion 623 is of a curved configuration.

Figure 20:
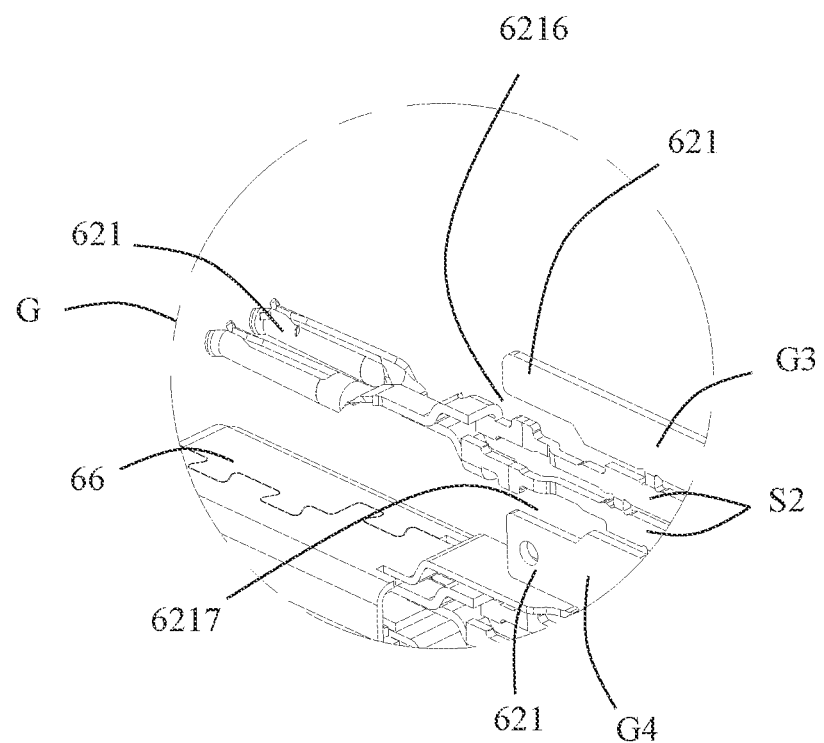
FIG. 20 is a partial enlarged view of a circled part G in FIG. 19.

Referring to FIG. 20, each group of second conductive terminals 62 include a plurality of third ground terminals G3, a plurality of fourth ground terminals G4, and a plurality of second signal terminals S2. In the illustrated embodiment of the present disclosure, two adjacent second signal terminals S2 form a pair of second differential signal terminals. Each pair of second differential signal terminals are located between one third ground terminal G3 and one fourth ground terminal G4. That is, each group of second conductive terminals 62 are disposed in a manner of G3-S2-S2-G4, which is beneficial to improve the quality of signal transmission. The second differential signal terminals are narrow-side coupling or wide-side coupling. A width of the third ground terminal G3 and a width of the fourth ground terminal G4 are greater than a width of each second signal terminal S2 therebetween, which is beneficial to increase the shielding area and improve the shielding effect.

Figure 21:
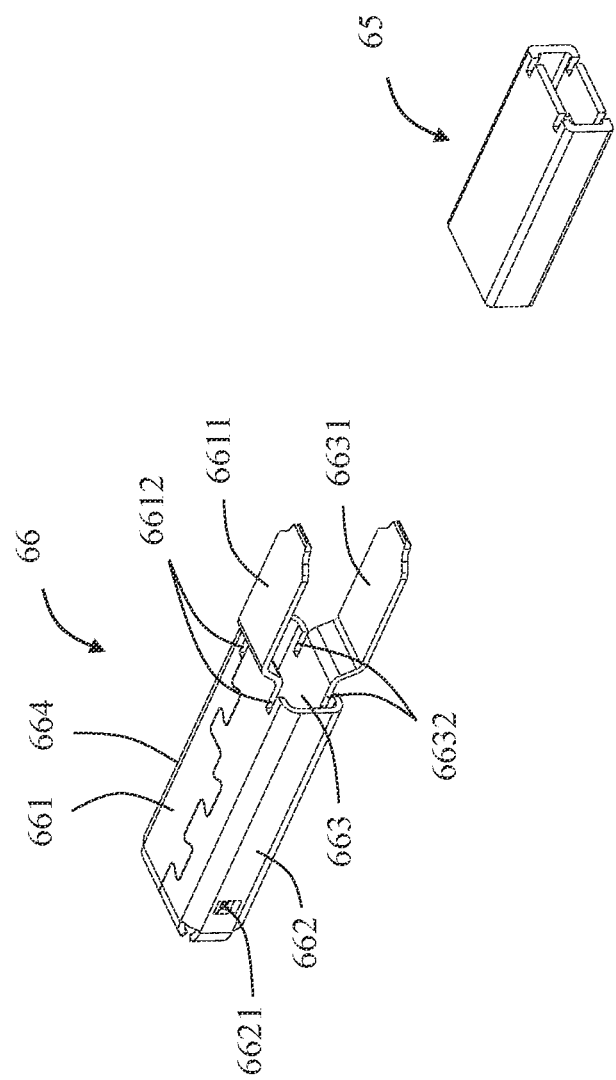
FIG. 21 is a perspective exploded view of an insulating block and a shielding shell.
Figure 22:
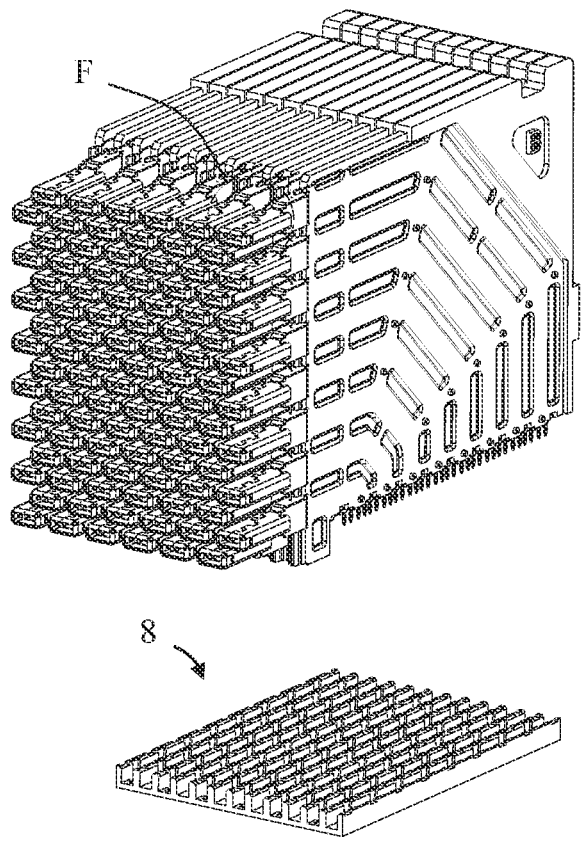
FIG. 22 is a partial perspective exploded view of the second backplane connector, in which a second mounting block is separated.
Figure 23:
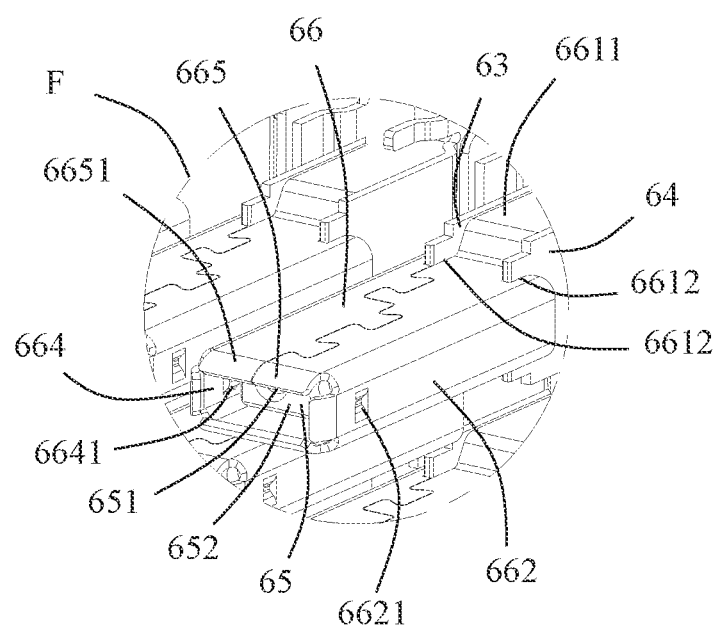
FIG. 23 is a partial enlarged view of a circled part F in FIG. 22.

Referring to FIGS. 21 to 23, each group of second terminal modules 6 further includes an insulating block 65 sleeved on the second contact portions 621, and a shielding shell 66 sleeved on the insulating block 65. Each insulating block 65 includes two through holes 651 into which the second contact portions 621 of the second signal terminals S2 are inserted, and a mating surface 652 at an end thereof. In the illustrated embodiment of the present disclosure, the insulating block 65 is substantially cuboid shaped. Correspondingly, the shielding shell 66 is substantially cuboid shaped. In an embodiment of the present disclosure, the insulating block 65 is fixed in the shielding shell 66, for example, by assembling.

The shielding shell 66 includes a first side wall 661, a second side wall 662, a third side wall 663 and a fourth side wall 664. The first side wall 661 is opposite to the third side wall 663. The second side wall 662 is opposite to the fourth side wall 664. An area of the first side wall 661 and the third side wall 663 is larger than an area of the second side wall 662 and the fourth side wall 664. The ends of the first side wall 661, the second side wall 662, the third side wall 663 and the fourth side wall 664 all include a deflection portion 665 which is bent inwardly. By providing the deflection portions 665, a constricted portion can be formed at an end of the shielding shell 66, so that outer surfaces 6651 of the deflection portions 665 can guide the second terminal module 6 to be assembled to the second header 5, and even guide the shielding shell 66 to be inserted into the shielding space 27 of the first backplane connector 100. In addition, in order to better restrict the insulating block 65, the second side wall 662 and the fourth side wall 664 further include restriction protrusions 6621, 6641 formed by stamping the second side wall 662 and the fourth side wall 664 inwardly. The restriction protrusions 6621, 6641 are used to mate with the insulating block 65 so as to prevent the insulating block 65 from being drawn out of the shielding shell 66.

In the illustrated embodiment of the present disclosure, the shielding shell 66 further includes a first extension piece 6611 extending from the first side wall 661 and a pair of first slots 6612 located on opposite sides of the first extension piece 6611. The shielding shell 66 further includes a second extension piece 6631 extending from the third side wall 663 and a pair of second slots 6632 located on opposite sides of the second extension piece 6631. The first extension piece 6611 is in vertical contact with the second contact portion 621 of the third ground terminal G3 so as to improve the shielding effect. The second extension piece 6631 is in vertical contact with the second contact portion 621 of the fourth ground terminal G4 so as to improve the shielding effect. In the illustrated embodiment of the present disclosure, the first extension piece 6611 and the second extension piece 6631 are deflected outwardly and then extend, so that a distance between the first extension piece 6611 and the second extension piece 6631 on the same shielding shell 66 is greater than a distance between the first side wall 661 and the third side wall 663. Referring to FIG. 20, for a group of second conductive terminals 62 arranged in the manner of G3-S2-S2-G4, the second contact portion 621 of the third ground terminal G3 includes a first notch 6216 adjacent to the second differential signal terminals. The first notch 6216 is used for receiving the first extension piece 6611. The second contact portion 621 of the fourth ground terminal G4 includes a second notch 6217 adjacent to the second differential signal terminals. The second notch 6217 is used for receiving the second extension piece 6631. In the illustrated embodiment of the present disclosure, taking two adjacent pairs of second differential signal terminals sharing one fourth ground terminal G4 as an example, two sides of the fourth ground terminal G4 respectively include second notches 6217 facing different second differential signal terminals, and the second notches 6217 are used for mating with two adjacent shielding shells 66.

Figure 24:
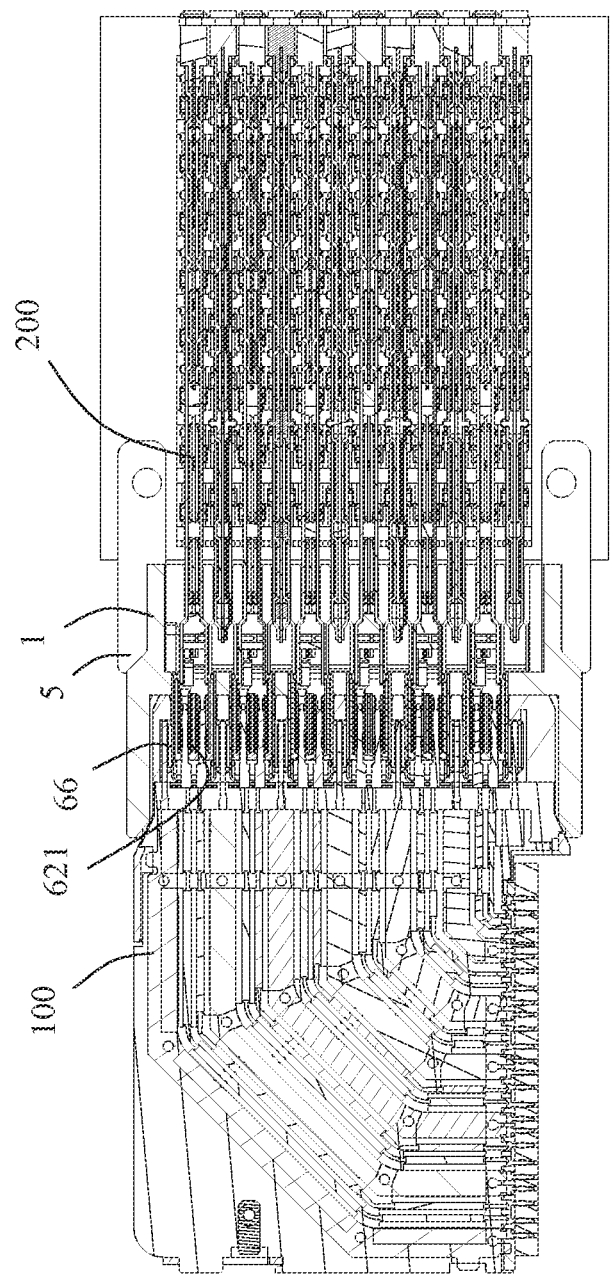
FIG. 24 is a schematic cross-sectional view taken along line J-J in FIG. 1.
Figure 25:
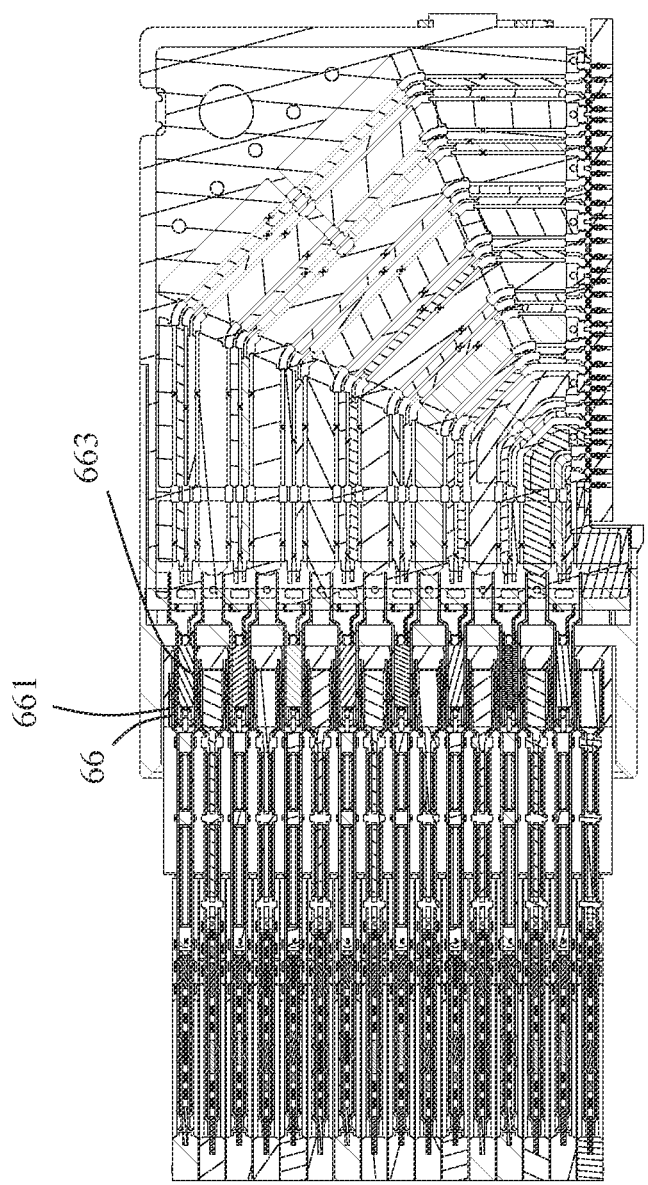
FIG. 25 is a schematic cross-sectional view taken along line K-K in FIG. 1.

Referring to FIGS. 23 to 25, when the first backplane connector 100 is mated with the second backplane connector 200, the first housing 1 of the first backplane connector 100 is inserted in the second header 5 of the second backplane connector 200. The shielding shells 66 of the second terminal modules 6 of the second backplane connector 200 are inserted into the shielding spaces 27 of the first backplane connector 100 under the guidance of the deflection portions 665. The first differential signal terminals of the first backplane connector 100 are mating with the second differential signal terminals of the second backplane connector 200 to achieve electrical connection. For ease of description, the second differential signal terminals of the second backplane connector 200 is also referred to as mating terminals.

Second Embodiment

Figure 26:
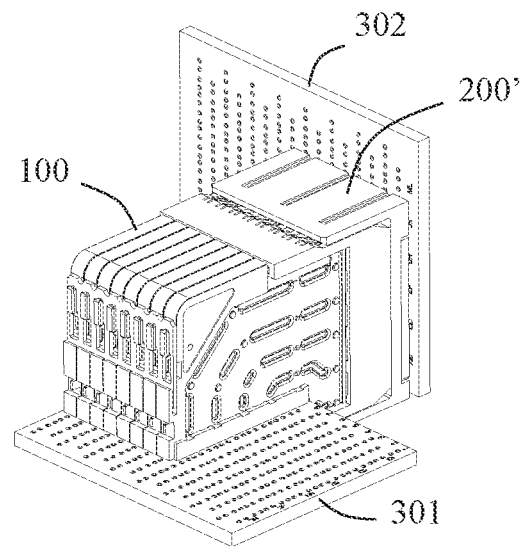
FIG. 26 is a perspective view of a backplane connector assembly in accordance with another embodiment of the present disclosure.
Figure 27:
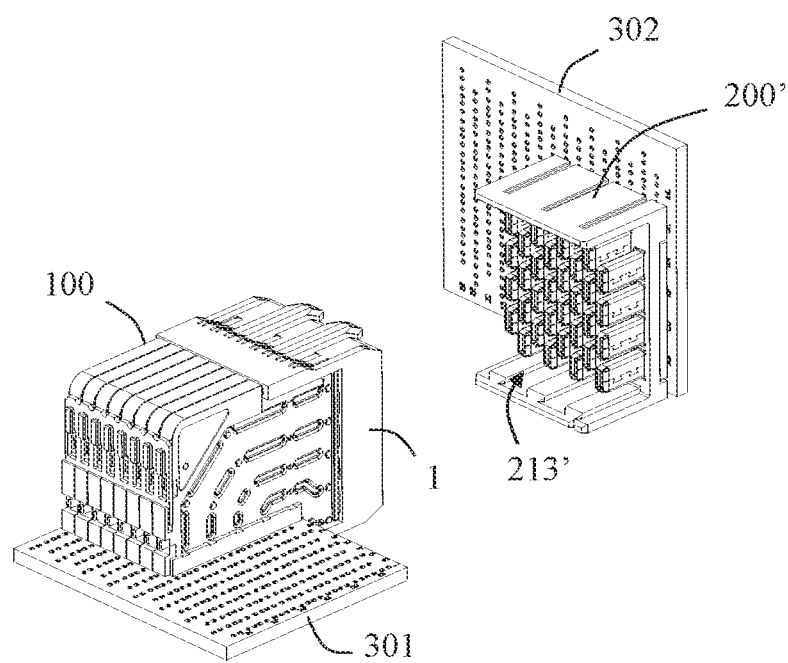
FIG. 27 is a partially exploded perspective view of FIG. 26.

Referring to FIGS. 26 and 27, the second embodiment of the present disclosure also discloses another backplane connector assembly which includes the first backplane connector 100 shown in FIGS. 1 to 16 and another second backplane connector 200' mated with the first backplane connector 100. The first backplane connector 100 is adapted for being mounted on the first circuit board 301. The second backplane connector 200' is adapted for being mounted on the second circuit board 302. Since the first backplane connector 100 has been described in detail in the first embodiment, it will not be described in detail in the second embodiment of the present disclosure, and its related structure will be directly quoted.

Figure 28:
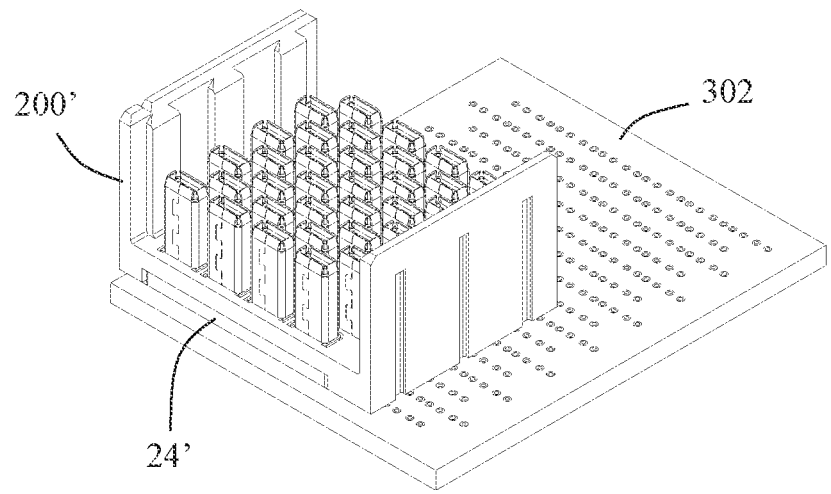
FIG. 28 is another view of a second backplane connector in FIG. 27 when it is mounted on a second circuit board.
Figure 29:
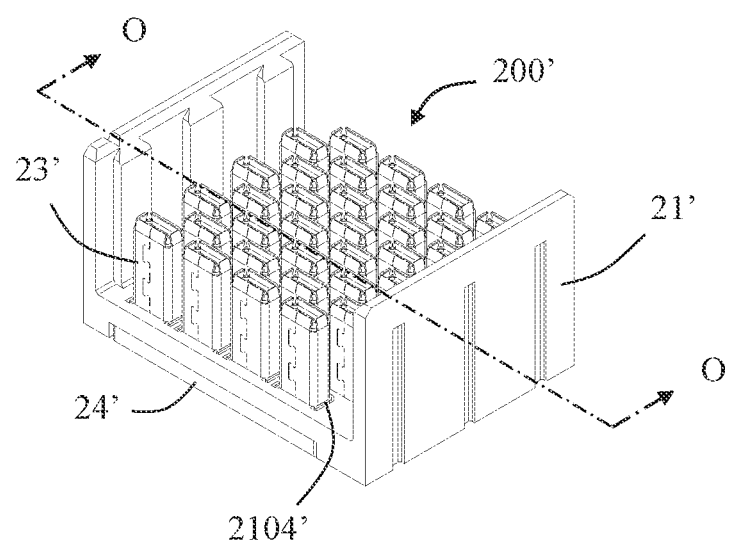
FIG. 29 is a perspective schematic view of the second backplane connector in FIG. 28.
Figure 30:
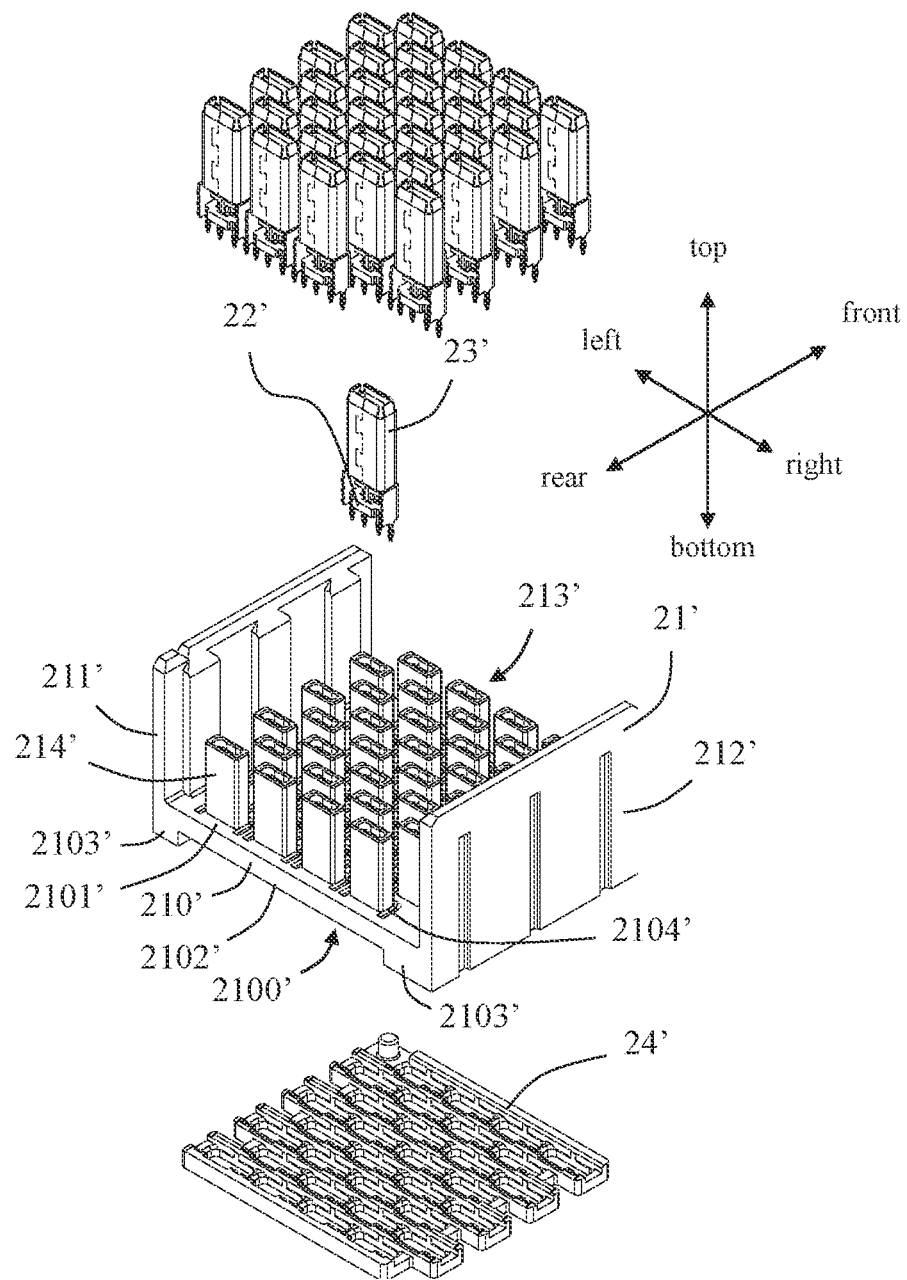
FIG. 30 is a partially exploded perspective view of the second backplane connector in FIG. 29.
Figure 31:
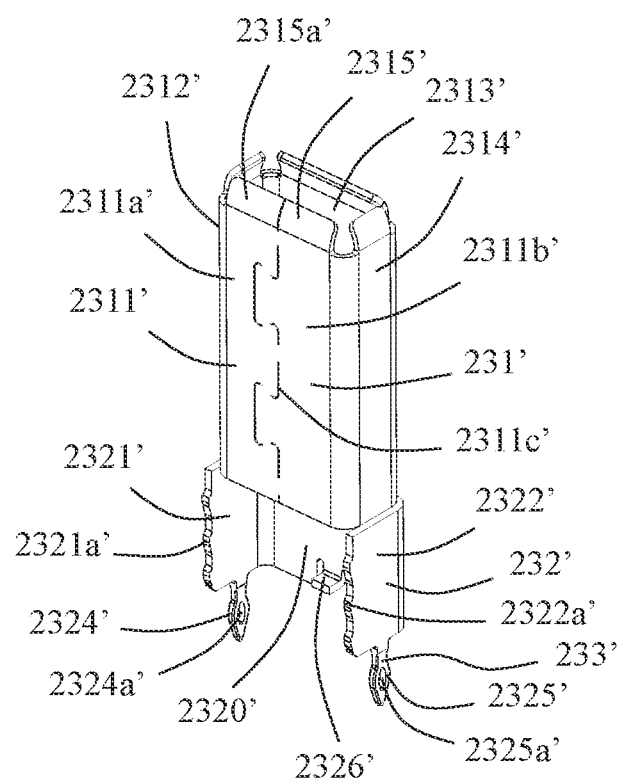
FIG. 31 is a perspective schematic view of a shielding shell.
Figure 32:
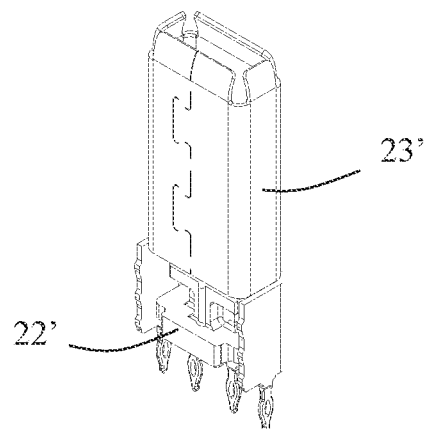
FIG. 32 is a perspective schematic view of the shielding shell when it is sleeved on a second terminal module.
Figure 33:
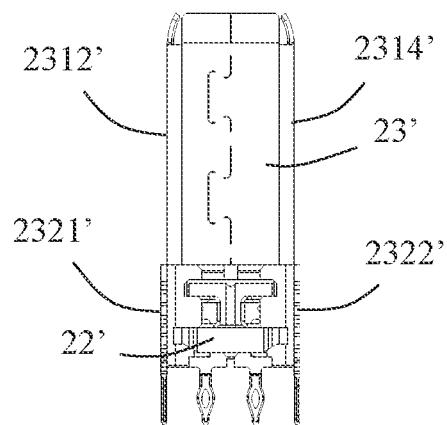
FIG. 33 is a front view of FIG. 32.
Figure 34:
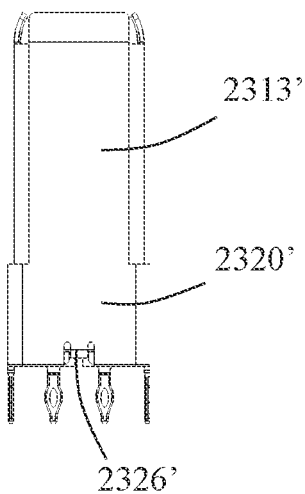
FIG. 34 is a rear view of FIG. 32.
Figure 35:
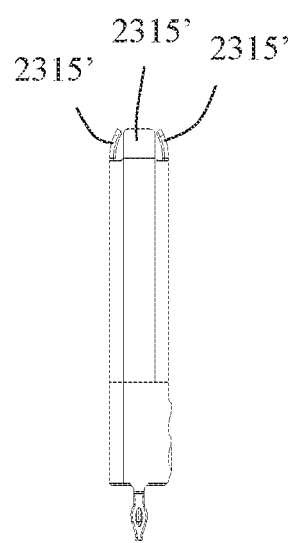
FIG. 35 is a left side view of FIG. 32.
Figure 36:
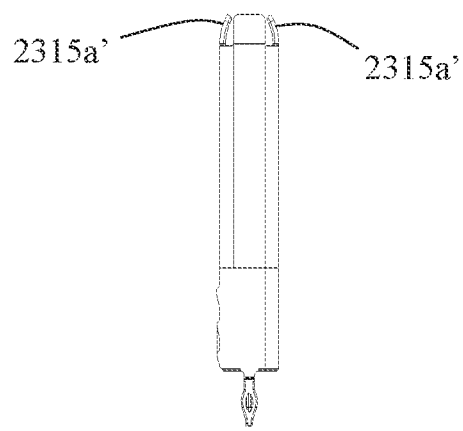
FIG. 36 is a right side view of FIG. 32.

Referring to FIGS. 28 to 30, the second backplane connector 200' includes a second housing 21', a plurality of second terminal modules 22' installed in the second housing 21', a plurality of shielding shells 23' fixed to the second housing 21' and located outside corresponding second terminal modules 22', and a second mounting block 24' mounted to the second housing 21'.

Referring to FIG. 30, the second housing 21' is made of insulating material and includes a base 210', a first side wall 211' extending upwardly from one side of the base 210', and a second side wall 212' extending upwardly from the other side of the base 210'. The base 210', the first side wall 211' and the second side wall 212' jointly form a receiving space 213' for receiving a part of the first backplane connector 100. In the illustrated embodiment of the present disclosure, the first side wall 211' and the second side wall 212' are parallel to each other and both are perpendicular to the base 210'.

In the illustrated embodiment of the present disclosure, the second housing 21' further includes a plurality of insulating protrusions 214' integrally extending from the base 210'. The plurality of insulating protrusions 214' are spaced apart from one another. The plurality of insulating protrusions 214' extend upwardly into the receiving space 213'. The plurality of insulating protrusions 214' are disposed in multiple rows along a front-to-rear direction. The insulating protrusions 214' in two adjacent rows are disposed in a staggered manner, that is, the insulating protrusions 214' in the same position in two adjacent rows are not in alignment with each other in the front-to-rear direction. The base 210' includes a top surface 2101' exposed in the receiving space 213', a bottom surface 2102' opposite to the top surface 2101', two mounting protrusions 2103' respectively protruding downwardly from opposite sides of the bottom surface 2102', and a receiving groove 2100' located between the two mounting protrusions 2103'. The receiving groove 2100' is adapted for receiving the second mounting block 24'.

Referring to FIGS. 29 and 30, the base 210' includes a plurality of positioning grooves 2104' extending through the top surface 2101'. In the illustrated embodiment of the present disclosure, each positioning groove 2104' is substantially U-shaped. The positioning groove 2104' is arranged around the corresponding insulating protrusion 214' and is used to install the corresponding shielding shell 23'. In the illustrated embodiment of the present disclosure, each positioning groove 2104' also extends through the bottom surface 2102' so as to communicate with the receiving groove 2100'.

Referring to FIGS. 31 to 37, in the illustrated embodiment of the present disclosure, the shielding shell 23' is formed by stamping, bending and riveting a metal plate. The shielding shell 23' includes a hollow portion 231', a mounting portion 232' extending downwardly from the hollow portion 231', and a plurality of mounting feet 233' extending downwardly from the mounting portion 232'. The hollow portion 231' includes a first side wall 2311', a second side wall 2312', a third side wall 2313' and a fourth side wall 2314' which are connected in sequence. The first side wall 2311' is opposite to the third side wall 2313', and the second side wall 2312' is opposite to the fourth side wall 2314', thereby forming an enclosed shielding cavity. Of course, in other embodiments, the shielding cavity may also be of a non-enclosed type. For example, the hollow portion 231' includes a first side wall 2311', a second side wall 2312', and a third side wall 2313' which are connected in sequence, so that the hollow portion 231' is substantially U-shaped. In the illustrated embodiment of the present disclosure, areas of the first side wall 2311' and the third side wall 2313' are larger than areas of the second side wall 2312' and the fourth side wall 2314'. Each end of the first side wall 2311', the second side wall 2312', the third side wall 2313' and the fourth side wall 2314' includes a deflection portion 2315' which is bent inwardly. The deflection portions 2315' are independent from one another so that they can be bent independently in order to avoid mutual interference. Each deflection portion 2315' has a guiding portion 2315a' on its outer surface. By providing the deflection portions 2315', a constricted opening can be formed at the end of the shielding shell 23'. The guiding portion 2315a' can guide the deflection portions 2315' from being easily inserted into the first backplane connector 100. In the illustrated embodiment of the present disclosure, the first side wall 2311' includes a first wall portion 2311a' and a second wall portion 2311b'. The first wall portion 2311a' and the second wall portion 2311b' are fixed together by riveting. A riveting line 2311c' is formed at a junction of the first wall portion 2311a' and the second wall portion 2311b'. In other embodiments of the present disclosure, it is also possible that only the ends of at least three of the first side wall 2311', the second side wall 2312', the third side wall 2313' and the fourth side wall 2314' which are connected to each other, are provided with the deflection portions 2315' bent inwardly. For example, ends of the second side wall 2312', the third side wall 2313' and the fourth side wall 2314', which are sequentially connected, include the deflection portion 2315' bent inwardly.

In the illustrated embodiment of the present disclosure, the mounting portion 232' is substantially U-shaped, and includes a base portion 2320', a first bending portion 2321' bent from one side of the base portion 2320', a second bending portion 2322' bent from the other side of the base portion 2320', a first tail portion 2324' extending downwardly from the first bending portion 2321', and a second tail portion 2325' extending downwardly from the second bending portion 2322'. The base portion 2320' is coplanar with the third side wall 2313'. The first bending portion 2321' and the second side wall 2312' are located on the same side. The first bending portion 2321' protrudes outwardly beyond the second side wall 2312'. The second bending portion 2322' and the fourth side wall 2314' are located on the same side. The second bending portion 2322' protrudes outwardly beyond the fourth side wall 2314'. The mounting portion 232' also includes a bottom retaining portion 2326' located at the base portion 2320'. In the illustrated embodiment of the present disclosure, when the shielding shell 23' is not mounted to the insulating protrusion 214', the retaining portion 2326' and the base portion 2320' are located in the same plane. After the shielding shell 23' is installed to the insulating protrusion 214', the retaining portion 2326' is bent inwardly (that is, in a direction toward the first side wall 2311') so that the retaining portion 2326' is perpendicular to the base portion 2320'. The retaining portion 2326' is located in the middle of the bottom edge of the base portion 2320'. A plurality of first barbs 2321a' are further provided on the side of the first bending portion 2321' away from the third side wall 2313'. A plurality of second barbs 2322a' are further provided on the side of the second bending portion 2322' away from the third side wall 2313'. The first barbs 2321a' and the second barbs 2322a' both extend beyond the first side wall 2311' to be fixed in the second housing 21'. The first tail portion 2324' is provided with a first fisheye hole 2324a', so that the first tail portion 2324' has a certain degree of elasticity. Therefore, the first tail portion 2324' can be easily pressed into the conductive hole of the second circuit board 302 for achieving electrical conduction. The second tail portion 2325' is provided with a second fisheye hole 2325a', so that the second tail portion 2325' has a certain elasticity. Therefore, the second tail portion 2325' can be easily pressed into the conductive hole of the second circuit board 302 for achieving electrical conduction. In the illustrated embodiment of the present disclosure, the first tail portion 2324' and the second tail portion 2325' are arranged parallel to each other and are in alignment with each other along the left-to-right direction.

Figure 37:
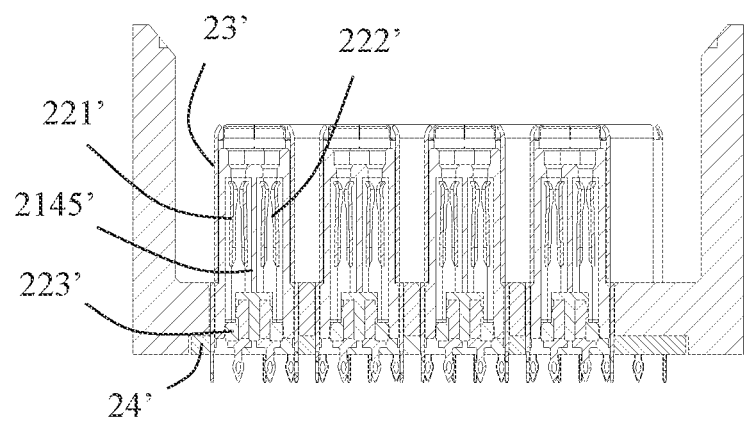
FIG. 37 is a schematic cross-sectional view taken along line O-O in FIG. 29.

Referring to FIG. 37, each second terminal module 22' includes a first signal terminal 221', a second signal terminal 222', and an insulative block 223' fixed to the first signal terminal 221' and the second signal terminal 222'. In an embodiment of the present disclosure, the first signal terminal 221' and the second signal terminal 222' are insert-molded with the insulative block 223'. In an embodiment of the present disclosure, the first signal terminal 221' and the second signal terminal 222' form a pair of differential signal terminals. In the illustrated embodiment of the present disclosure, the first signal terminal 221' and the second signal terminal 222' are symmetrically arranged along a central axis of the insulative block 223'.

When assembling, firstly, the plurality of shielding shells 23' are sleeved on the insulating protrusions 214' along a top-to-bottom direction, so that the hollow portions 231' enclose the insulating protrusions 214'. The U-shaped mounting portions 232' are inserted into the U-shaped positioning grooves 2104'. The first tail portions 2324' and the second tail portions 2325' respectively extend beyond the bottom surface 2102' and are exposed in the receiving groove 2100'. The mounting portions 232' are partially exposed in the receiving groove 2100' to increase the shielding length of the first signal terminal 221' and the second signal terminal 222'. When the shielding shells 23' are installed in place, the first barbs 2321a' and the second barbs 2322a' will pierce the inner wall of the positioning grooves 2104' so as to improve the fixing force.

Secondly, the second terminal modules 22' are inserted into the corresponding positioning grooves 2104' along a bottom-to-top direction. When the second terminal modules 22' are installed in place, top surfaces of the insulating blocks 223' press against bottom surfaces of partitions 2145' so as to achieve position restriction.

Thirdly, the retaining portions 2326' are bent inwardly so that the retaining portions 2326' abut against the corresponding insulating blocks 223'. With this arrangement, on the one hand, the shielding shells 23' can be prevented from escaping upwardly from the insulating protrusions 214', and on the other hand, the second terminal modules 22' can be prevented from being separated from the second housing 21'.

Finally, the second mounting block 24' is installed in the receiving groove 2100' along the bottom-to-top direction. The first tail portions 2324' and the second tail portions 2325' of the shielding shell 23' extend through mounting holes 243' of the second mounting block 24' so as to be electrically connected to the second circuit board 302.

When the first backplane connector 100 is mated with the second backplane connector 200', the first housing 1 of the first backplane connector 100 is inserted into the receiving space 213' of the second housing 21' of the second backplane connector 200'. The hollow portions 231' of the second terminal modules 22' of the second backplane connector 200' are inserted into the shielding spaces 27 of the first backplane connector 100 under the guidance of the deflection portions 2315'. The first differential signal terminals of the first backplane connector 100 are mating with the first signal terminals 221' and the second signal terminals 222' of the second backplane connector 200' to achieve electrical connection. For ease of description, the first signal terminals 221' and the second signal terminals 222' of the second backplane connector 200 are also referred to as mating terminals.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector assembly, comprising a first backplane connector and a second backplane connector for mating with the first backplane connector, the first backplane connector comprising a first terminal module, the first terminal module comprising:
    a plurality of first conductive terminals, each of the first conductive terminals comprising a first connection portion and a first contact portion;
    a first insulating bracket fixed with the first connection portion;
    a first metal shield comprising a first extension portion; and
    a second metal shield comprising a second extension portion;
    wherein the first conductive terminals comprise first differential signal terminals, a first ground terminal and a second ground terminal, and the first differential signal terminals are located between the first ground terminal and the second ground terminal;
    the second backplane connector comprising a second terminal module, the second terminal module comprising mating terminals for mating with the first differential signal terminals;
    wherein the first extension portion, the second extension portion, the first contact portion of the first ground terminal and the first contact portion of the second ground terminal jointly form a shielding space, and the first contact portions of the first differential signal terminals are located in the shielding space; and
    wherein the second terminal module comprises a shielding shell enclosing a periphery of the mating terminals, and the shielding shell is received in the shielding space.

2. The backplane connector assembly according to claim 1, wherein the shielding shell comprises a first side wall, a second side wall, a third side wall and a fourth side wall;
    wherein the first side wall, the second side wall, the third side wall and the fourth side wall are connected in sequence;
    wherein the first side wall and the third side wall are disposed face to face;
    wherein the second side wall and the fourth side wall are disposed face to face; and
    wherein the first side wall, the second side wall, the third side wall and the fourth side wall jointly form a hollow portion.

3. The backplane connector assembly according to claim 2, wherein each end of the first side wall, the second side wall, the third side wall and the fourth side wall comprises a deflection portion bent inwardly;
    wherein the deflection portions are spaced apart from each other; and
    wherein the deflection portions are adapted for guiding insertion of the shielding shell into the shielding space.

4. The backplane connector assembly according to claim 2, wherein the second terminal module comprises a second insulating bracket, a plurality of second conductive terminals insert-molded with the second insulating bracket, a third metal shield disposed on one side of the second insulating bracket, and a fourth metal shield sheet disposed on the other side of the second insulating bracket; wherein the second conductive terminals comprise the mating terminals, a third ground terminal and a fourth ground terminal;
    the shielding shell comprises a first extension piece protruding from the first side wall and a pair of first slots located on opposite sides of the first extension piece; wherein the shielding shell comprises a second extension piece protruding from the third side wall and a pair of second slots located on opposite sides of the second extension piece;
    wherein the first extension piece and the second extension piece are in contact with the third ground terminal and the fourth ground terminal, respectively; and
    wherein the first slots and the second slots located on one same side of the first extension piece and the second extension piece are adapted to fix the third metal shield; and wherein the first slot and the second slot located on the other same side of the first extension piece and the second extension piece are adapted to fix the fourth metal shield.

5. The backplane connector assembly according to claim 1, wherein the second terminal module further comprises an insulating block sleeved on the mating terminals, and the shielding shell is sleeved on the insulating block.

6. The backplane connector assembly according to claim 2, wherein the second backplane connector comprises a second housing, the second housing comprises a base and a plurality of insulating protrusions integrally extending from the base, the insulating protrusions are spaced apart from each other, the mating terminals comprise a first signal terminal and a second signal terminal, and each insulating protrusion comprises a first terminal receiving hole to receive the first signal terminal and a second terminal receiving hole to receive the second signal terminal.

7. The backplane connector assembly according to claim 6, wherein the second housing comprises a partition to separate the first terminal receiving hole and the second terminal receiving hole, the second terminal module comprises an insulative block fixed on the first signal terminal and the second signal terminal, and a top surface of the insulative block abuts against a bottom surface of the partition for position restriction.

8. The backplane connector assembly according to claim 7, wherein the shielding shell further comprises a mounting portion extending from the hollow portion, the mounting portion comprises a base portion, a first bending portion bent from one side of the base portion, and a second bending portion bent from the other side of the base portion; wherein the base portion is connected to the third side wall, the first bending portion and the second side wall are located on a same side, and the second bending portion and the fourth side wall are located on a same side; and wherein the base is coplanar with the third side wall, the first bending portion protrudes outwardly beyond the second side wall, and the second bending portion protrudes outwardly beyond the fourth side wall.

9. The backplane connector assembly according to claim 8, wherein the base comprises a plurality of positioning grooves each of which corresponds to the insulating protrusion, the positioning groove at least partially surrounds a part of the insulating protrusion, and the first bending portion, the second bending portion and the base portion are positioned in the positioning groove.

10. The backplane connector assembly according to claim 8, wherein the mounting portion comprises a retaining portion abutting against the insulative block, and retaining portion is adapted to restrict the insulative block from being separated downwardly from the base.

11. The backplane connector assembly according to claim 8, wherein the first bending portion is provided with a plurality of first barbs on a side away from the third side wall, the second bending portion is provided with a plurality of second barbs on a side of away from the third side wall, and the first barbs and the second barbs are adapted for being fixed in the second housing.

12. The backplane connector assembly according to claim 1, wherein the first extension portion comprises a first bulge protruding toward the first ground terminal and a second bulge protruding toward the second ground terminal;

wherein the second extension portion comprises a third bulge protruding toward the first ground terminal and a fourth bulge protruding toward the second ground terminal; and wherein the first bulge and the third bulge are respectively in contact with opposite side surfaces of the first contact portion of the first ground terminal, and the second bulge and the fourth bulge are respectively in contact with opposite side surfaces of the first contact portion of the second ground terminal, thereby forming the shielding space.

13. The backplane connector assembly of claim 12, wherein the first connection portions of the first differential signal terminals, the first connection portion of the first ground terminal, and the first connection portion of the second ground terminal are located in a first plane; wherein the first ground terminal comprises a first torsion portion connecting the first connection portion of the first ground terminal and the first contact portion of the first ground terminal; wherein the second ground terminal comprises a second torsion portion connecting the first connection portion of the second ground terminal and the first contact portion of the second ground terminal; and wherein the first contact portion of the first ground terminal and the first contact portion of the second ground terminal are parallel and perpendicular to the first plane.

14. The backplane connector assembly according to claim 13, wherein the first contact portion of the first ground terminal comprises two first wide surfaces and two first narrow surfaces; wherein the first contact portion of the second ground terminal comprises two second wide surfaces and two second narrow surfaces; wherein the first bulge and the third bulge are respectively in contact with the first narrow surfaces of the first ground terminal, and the second bulge and the fourth bulge respectively in contact with the second narrow surfaces of the second ground terminal.

* * * * *